United States Patent [19]

Suzuki et al.

[11] 4,389,582
[45] Jun. 21, 1983

[54] MOS INTEGRATED LOGIC CIRCUIT DEVICE WITH IMPROVED SWITCHING SPEED CHARACTERISTICS

[75] Inventors: Yasoji Suzuki; Kenji Matsuo, both of Kawasaki, Japan

[73] Assignee: Tokyo Shibaura Denki Kabushiki Kaisha, Kawasaki, Japan

[21] Appl. No.: 116,556

[22] Filed: Jan. 29, 1980

[30] Foreign Application Priority Data

Feb. 9, 1979 [JP] Japan .................................. 54-13412
Feb. 9, 1979 [JP] Japan .................................. 54-13413
Feb. 9, 1979 [JP] Japan .................................. 54-13892

[51] Int. Cl.³ ................ H03K 19/017; H03K 19/096; H03K 19/20
[52] U.S. Cl. .................................... 307/452; 307/481; 307/279; 307/579
[58] Field of Search ............... 307/481, 445, 443, 449, 307/451, 452, 453, 448, 468, 469, 577, 579, 495, 480, 279

[56] References Cited

U.S. PATENT DOCUMENTS 3,737,673  6/1973  Suzuki .................................. 307/452
3,945,000  3/1976  Suzuki et al. ...................... 307/451 X
4,002,933  1/1977  Leuschner ........................... 307/445
4,114,049  9/1978  Suzuki .................................. 307/481

Primary Examiner—Larry N. Anagnos
Attorney, Agent, or Firm—Finnegan, Henderson, Farabow, Garrett & Dunner

[57] ABSTRACT

A semiconductor integrated circuit device, which comprises:
  transistors constituting a plurality of series-connected logic circuits, wherein some of the mutually-facing or paired transistors of every two adjacent series-connected logic circuits or at least one pair thereof are so connected as to span said two adjacent circuits with a common gate provided between said paired transistors;
  conductors for connecting the source electrodes and/or the drain electrodes of said spanning paired transistors; and
  a plurality of signal generators for supplying required signals to the respective transistors, and whereby a MOS type logic circuit constructed by arranging those of the transistors which are supplied with a synchronizing signal closer to the output terminal than those of the transistors which are supplied with an input signal can be accelerated in operation.

3 Claims, 29 Drawing Figures

F I G. 15
| LEVEL OF $\overline{CP}$ | "L" | "H" | |
|---|---|---|---|
| REGION / MOST | INITIAL STAGE | 1 | 2 |
| N-MOST 18 | SATURATED | OPERATION IN SATURATED STATE | OPERATION IN UNSATURATED STATE |
| N-MOST 19 | CUTOFF | OPERATION IN UNSATURATED STATE | |
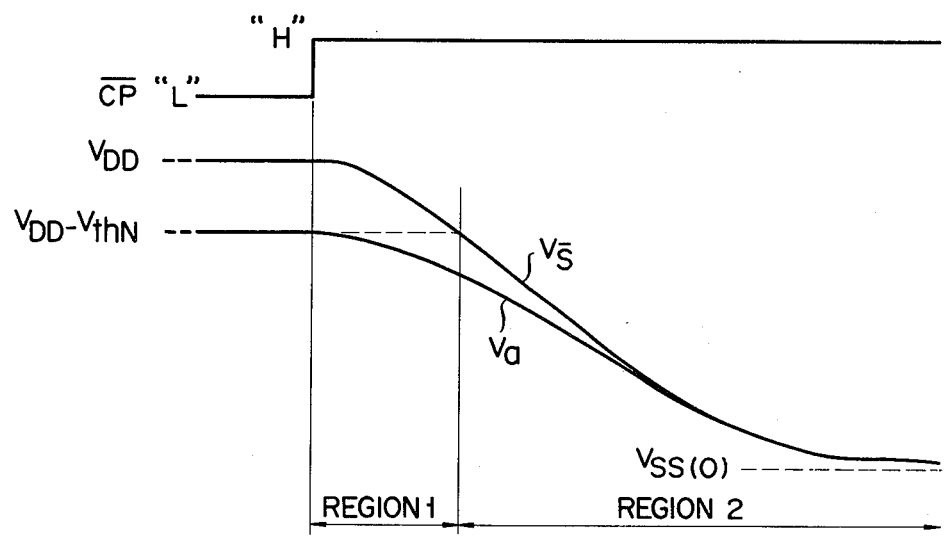
F I G. 16

| LEVEL OF $\overline{CP}$ | "L" | "H" | |
|---|---|---|---|
| REGION / MOST | INITIAL STAGE | 1 | 2 |
| N-MOST 19 | CUTOFF | OPERATION IN SATURATED STATE | OPERATION IN UNSATURATED STATE |
| N-MOST 18 | OPERATION IN UNSATURATED STATE | OPERATION IN UNSATURATED STATE | |

| LEVEL OF Qs | "H" | "L" | | |
|---|---|---|---|---|
| REGION / MOST | INITIAL STAGE | 1 | 2 | 3 |
| P-MOST 14 | UNSATURATED | OPERATION IN UNSATURATED STATE | | |
| P-MOST 16 | CUTOFF | OPERATION IN UNSATURATED STATE | | |
| P-MOST 15 | SATURATED | SATU-RATED | OPERATION IN UNSATURATED STATE | |
| N-MOST 19 | UNSATURATED | OPERATION IN UNSATURATED STATE | | SATURATED |

F I G. 25
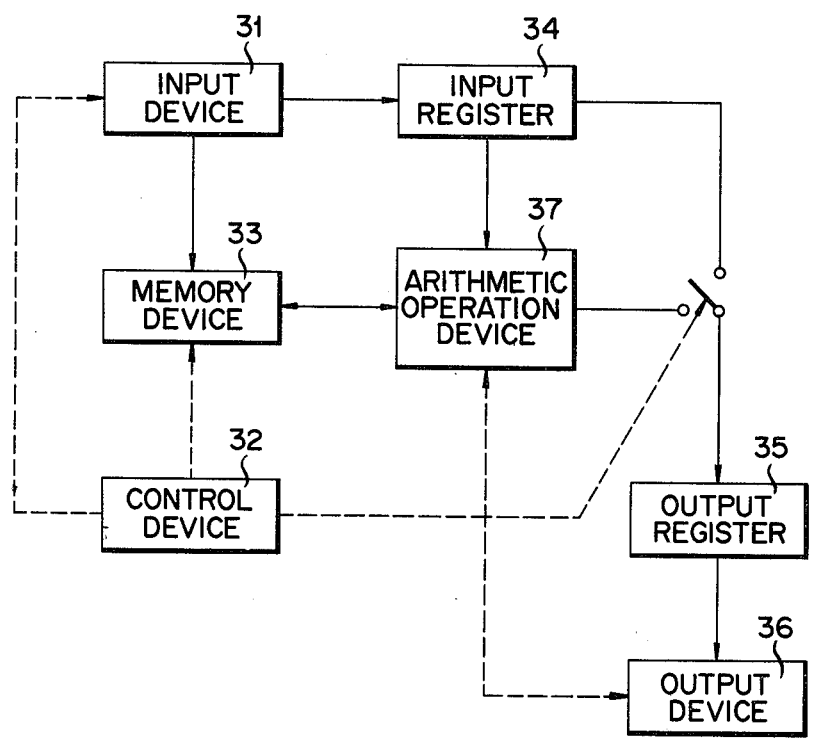

MOS INTEGRATED LOGIC CIRCUIT DEVICE WITH IMPROVED SWITCHING SPEED CHARACTERISTICS

BACKGROUND OF THE INVENTION

This invention relates to a semiconductor integrated circuit device, and more particularly to a semiconductor integrated circuit device for a MOS type logic circuit, wherein said logic circuit can be accelerated in operation.

The high density and highly accelerated operation of integrated circuits are now a matter of the greatest concern in the industry of integrated circuit devices.

This invention aims at improvement of the switching property of integrated circuits by designing the arrangement of said circuits and the patterns defined thereon.

A flip-flop circuit using insulated gate type field effect transistors generally includes various forms. For instance, a flip-flop circuit adopted for large scale integration includes a master-slave type J-K flip-flop circuit system including an AND-NOR flip-flop circuit having such arrangement as shown in FIG. 1.

The master-slave type J-K flip-flop circuit system comprises two AND-NOR flip-flop circuits, each of which is used as a master guide or a slave gate, thereby ensuring reliable data transmission and toggle action, independently of the length of time required for the rise or fall of a clock pulse or a length of time consumed before the termination of the whole clock pulse.

A plurality of flip-flop circuits each arranged as shown in FIG. 1 are practically integrated with high density on a one-chip semiconductor substrate. However, these flip-flop circuits are subject to limitations particularly in respect of the switching speed due to the specific arrangement of an integrated circuit device itself.

The aforesaid AND-NOR flip-flop circuit 11 is arranged as shown in FIGS. 2 and 3. The transistors (1), (2), (3), (4), (5), (6), (8), (10) respectively have diffused source and drain regions and wiring made of, for example, aluminium. These components jointly provide a junction capacitance and floating capacitance. Therefore, a time constant $\tau = CR$ (a product of capacitance by resistance) is unavoidably defined by said junction capacitance and floating capacitance. With the AND-NOR flip-flop circuits 11, the above-mentioned junction capacitances and floating capacities are collectively expressed as $C_a$, $C_{b2}$, $C_{c2}$, $C_P$, $C_N$.

This invention has been accomplished in view of the above-described drawbacks, and is intended to provide a semiconductor integrated circuit device in which the aforesaid stray capacities are reduced to ensure high speed operation. The arrangement of a semiconductor integrated circuit device allowing for high speed operation has been realized from the arrangement of FIG. 4 which has been defined by analyzing the arrangement of the prior art AND-NOR flip-flop circuit 11.

There will now be described the results of said analysis. With the prior art AND-NOR flip-flop circuit 11. The time constant $\tau = CR$ in question exerts its effect on the rise of a clock pulse. Referring to FIG. 2, since Preset signal has a low level "L", a clock pulse rises when an N channel transistor 4 is rendered nonconducting and a P channel transistor 10 is rendered conducting, and since a $Q_M$ signal has a low level "L", when an N channel transistor 2 is rendered nonconducting, and a P channel transistor 6 is rendered conducting. Further since a $\overline{CLOCK}$ signal has a fully high level "H" as viewed from the rising characteristic of the clock pulse, the clock pulse rises when a $Q_S$ output signal from the flip-flop circuit has its level shifted from "H" to "L", while an N channel transistor 1 is rendered conducting and a P channel transistor 5 is rendered nonconducting. Where the $Q_S$ signal has its level changed from "H" to "L", then an N channel transistor 3 is rendered nonconducting, and a P channel transistor 8 is rendered conducting. Therefore, the output terminal of the arrangement of FIG. 4 produces an output signal $\overline{Q_S}$ ("L"→"H") having an optional rising time. With the flip-flop circuit of FIG. 2, therefore, the transistors 6, 8, 10 are considered to be associated with the rising property of a clock pulse. Consequently, the stray capacities $C_{b2}$, $C_{c2}$, $C_P$, $C_N$ may be regarded as affecting the rising property of a clock pulse. Thus, FIG. 4 may be taken to represent an improved arrangement derived from the analysis of the prior art flip-flop circuit.

Referring to FIG. 4, a voltage impressed between the electrodes of the respective transistors may be expressed as follows:

P channel transistor 8

$$\begin{cases} V_{DS8} = V_{\overline{S}} - V_{b2} \\ V_{GS8} = V_L - V_{b2} \simeq -V_{b2} \end{cases} \longrightarrow$$

$$\begin{cases} |V_{DS8}| = V_{b2} - V_{\overline{S}} \\ |V_{GS8} - V_{th}| = V_{b2} - |V_{thP}| \end{cases}$$

$\therefore$ At $0 \leq V_{\overline{S}} \leq |V_{thP}|$, the P channel transistor is operated in a saturated state, and at $|V_{thP}| \leq V_{\overline{S}} \leq V_{DD}$, is operated in an unsaturated state.

P channel transistor 6

$$\begin{cases} V_{DS6} = V_{b2} - V_{c2} \\ V_{GS6} = V_L - V_{c2} \simeq -V_{c2} \end{cases} \longrightarrow$$

$$\begin{cases} |V_{DS6}| = V_{c2} - V_{b2} \\ |V_{GS6} - V_{th}| = V_{c2} - |V_{thP}| \end{cases}$$

$\therefore$ At $0 \leq V_{b2} \leq |V_{thP}|$, the P channel transistor 6 is operated in a saturated state, and, at $|V_{thP}| < V_{b2} \leq V_{DD}$, is operated in an unsaturated state.

So long as the P transistors 6, 8 are of the enhancement type, there results the formula $|V_{DS6}| \leq |V_{GS6} - V_{th}|$ from $|V_{GS8}| = |V_L - V_{b2}| \simeq V_{b2} \geq |V_{thP}|$. The P channel transistor 6 always remains extremely unsaturated. With a P channel transistor 10 there results $V_{c2} \geq |V_{thP}|$ from the same point of view. Therefore, the P channel transistor 10 is always operated in an unsaturated state.

Current equations established at the respective nodes b2, c2, $\overline{S}$ run as follows: At node c2:

$I_{DSP10}(\text{unsaturated}) + I_{c2}(\text{charged}) = I_{DSP6}(\text{unsaturated})$ \hfill (1)

At node b2:

$I_{DSP6}(\text{unsaturated}) + I_{b2}(\text{charged}) = I_{DSP8}(\text{saturated/unsaturated})$ \hfill (2)

At node $\overline{S}$:

$I_{DSP8}(\text{saturated/unsaturated}) = I_P(\text{discharged}) + I_N(\text{charged})$ \hfill (3)

Where the above-mentioned conditions are closely examined, it is seen that the rising characteristic of a signal eventually means a factor by which the output capacitors $C_P$, $C_N$ can be charged as quickly as possible by impressing the power source voltage $V_{DD}$ through the P channel transistors 10, 6, 8.

The speed at which said capacitors $C_P$, $C_N$ are charged is governed, as seen from the above equation (3), by the mutual conductance gm of the P channel transistor 8.

According to the arrangement of FIG. 4, a phenomenon of equilibrium in which the charge and discharge of an electric energy apparently cease to fix the voltage occurs in the junction capacitors $C_{b2}$, $C_{c2}$. These junction capacitors $C_{b2}$, $C_{c2}$ which are fundamentally passive elements undertaking the charge and discharge of electric energy cause node currents $I_{b2}$, $I_{c2}$ to flow in the directions of the upward and downward directed arrows indicated in FIG. 4. The terminal voltages (node voltages) $V_{b2}$, $V_{c2}$ of the junction capacitors $C_{b2}$, $C_{c2}$ vary in accordance with the amount of electric energy charged or discharged. The aforesaid phenomenon of equilibrium denotes a condition in which the amount of charged electric energy and that of discharged electric energy are balanced. The rising characteristic of a signal is such that the junction capacitors $C_{b2}$, $C_{c2}$ are charged due to the presence of the aforesaid phenomenon of equilibrium, thereby sharply decreasing the corresponding terminal voltages $V_{b2}$, $V_{c2}$. The decreased terminal voltages $V_{b2}$, $V_{c2}$ regain the original level in a certain length of time. However, a length of time consumed in the charge and discharge of electric energy is a very important factor for an integrated circuit device whose accelerated operation is aimed at. To this end, it is desired to decrease the capacities of the junction capacitors $C_{b2}$, $C_{c2}$ in order to reduce a length of time consumed in the charge and discharge of electric energy.

The above-mentioned phenomenon of equilibrium has such effect that in the initial stage of the rise of an output signal $\overline{Q_S}$, substantially no electric energy is charged in the capacitors $C_P$, $C_N$ because of $C_{b2} << C_P+C_N$ and $C_{c2} << C_P+C_N$. In view of this event, it is necessary to charge the junction capacitor $C_{b2}$ with as much electric energy as possible at a point of time when the state of equilibrium has passed. Further, it is necessary to reduce the product of CR at node b2. This consideration is also applicable to the products of CR at other nodes.

Referring to the prior art integrated circuit device shown in FIG. 3, the P channel transistors 5, 6 are formed at node b2, with their drain regions provided in common, as seen from the indicated pattern. As a result, the source capacitance of the P channel transistor 8, the drain capacitance of the P channel transistor 5 and the drain capacitance of the P channel transistor 6 are added together. These added capacitances and the resistances at the respective nodes which result from the diffusion of elements cooperate to increase the product of CR. This problem also arises with respect to the drain capacitance of the P channel transistor 10 and the source capacitances of the P channel transistors 5, 6. Therefore, the pattern of FIG. 3 is extremely unfavorable for a semiconductor integrated circuit device whose accelerated operation is aimed at.

SUMMARY OF THE INVENTION

It is accordingly an object of this invention to provide a semiconductor integrated circuit device whose accelerated operation is ensured by reducing the junction capacitance (or node capacitance) resulting from the diffusion of elements in a MOS type integrated circuit.

Another object of the invention is to provide a semiconductor integrated circuit device wherein a path through which electric energy is charged in the stray capacitor of the MOS type integrated circuit is formed of substantially more than two transistors and whose accelerated operation is effected by utilizing the mutual conductance gm of said more than two transistors.

Still another object of the invention is to provide a semiconductor integrated circuit device whose accelerated operation is realized by preventing the leakage of electric energy charged in the MOS type integrated circuit.

A further object of the invention is to provide a semiconductor integrated circuit device whose accelerated operation is aimed at by improving the rising or falling characteristic of an output signal corresponding to an input signal supplied to the MOS type integrated circuit.

According to one aspect of this invention, there is provided a semiconductor integrated circuit device which comprises:

a plurality of series circuits each constructed by connecting a plurality of transistors of a first conductivity type in series between a first power source and an output terminal;

a plurality of series circuits each constructed by connecting a transistor of a second conductivity type in series between a second power source and the output terminal;

a plurality of signal generators for supplying required signals to the respective transistors of the first and second conductivity types; and wherein at least one pair of transistors included in the transistors of the first conductivity type constituting said plural series circuits are so connected as to span every two adjacent series circuits and provided with a common gate.

According to another aspect of the invention, there is provided a semiconductor integrated circuit device which comprises:

a plurality of series circuits each constructed by connecting a plurality of transistors of the first conductivity type in series between a first power source and output terminal;

a plurality of series circuits each constructed by connecting a transistor of the second conductivity type in series between a second power source and output terminal;

a plurality of signal generators for supplying required signals to the respective transistors of the first and second conductivity types;

at least one pair of transistors included in the transistors of the first conductivity type constituting said plural series circuits, said paired transistors being so connected as to span every two adjacent series circuits and provided with a common gate; and conductors for connecting together the source electrodes and/or drain electrodes of the respective transistors.

According to still another aspect of the invention, there is provided a semiconductor integrated circuit device which comprises:

a plurality of series circuits each constructed by connecting a plurality of transistors of the first conductivity type in series between a first power source and output terminal;

a plurality of series circuits each constructed by connecting a transistor of a second conductivity type between the second power source and output terminal;

a plurality of signal generators for supplying required signals to the respective transistors of the first and second conductivity types;

at least one pair of transistors included in the transistors of the first conductivity type constituting said plural series circuits, said paired transistors being so connected as to span every two adjacent series circuits and provided with a common gate, and wherein the transistors which are supplied with a synchronizing signal included in said signals are disposed closer to the output terminal than the transistors which are supplied with an input signal.

BRIEF DESCRIPTION OF THE DRAWINGS

FIG. 15 is a chart showing the operating condition of the circuit arrangement of FIG. 13;

FIG. 16 is a curve diagram showing change in the operating condition indicated in FIG. 15;

FIG. 25 indicates the arrangement of a device for defining the curves of FIG. 24;

DETAILED DESCRIPTION OF THE PREFERRED EMBODIMENTS

Figure 1:
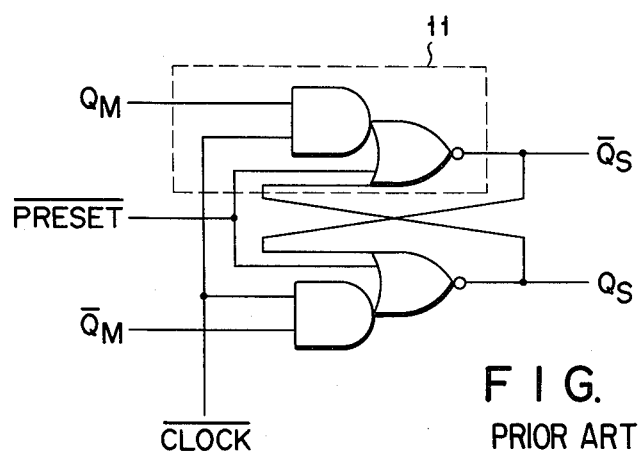
FIG. 1 is a logic diagram of a common flip-flop circuit.
Figure 2:
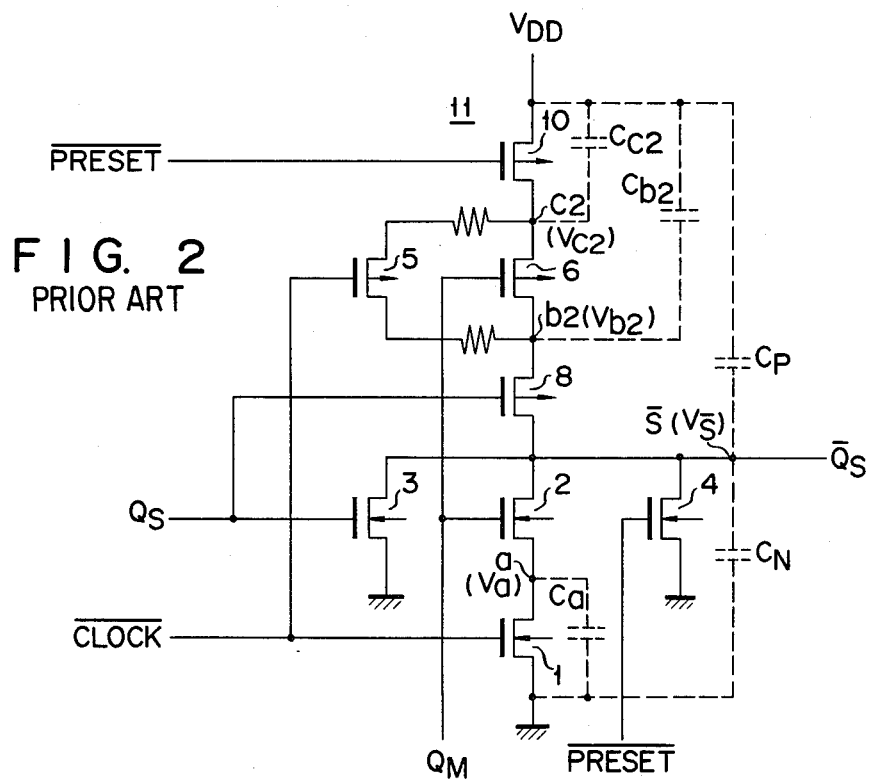
FIG. 2 shows the concrete arrangement of an AND-NOR circuit included in FIG. 1.
Figure 3:
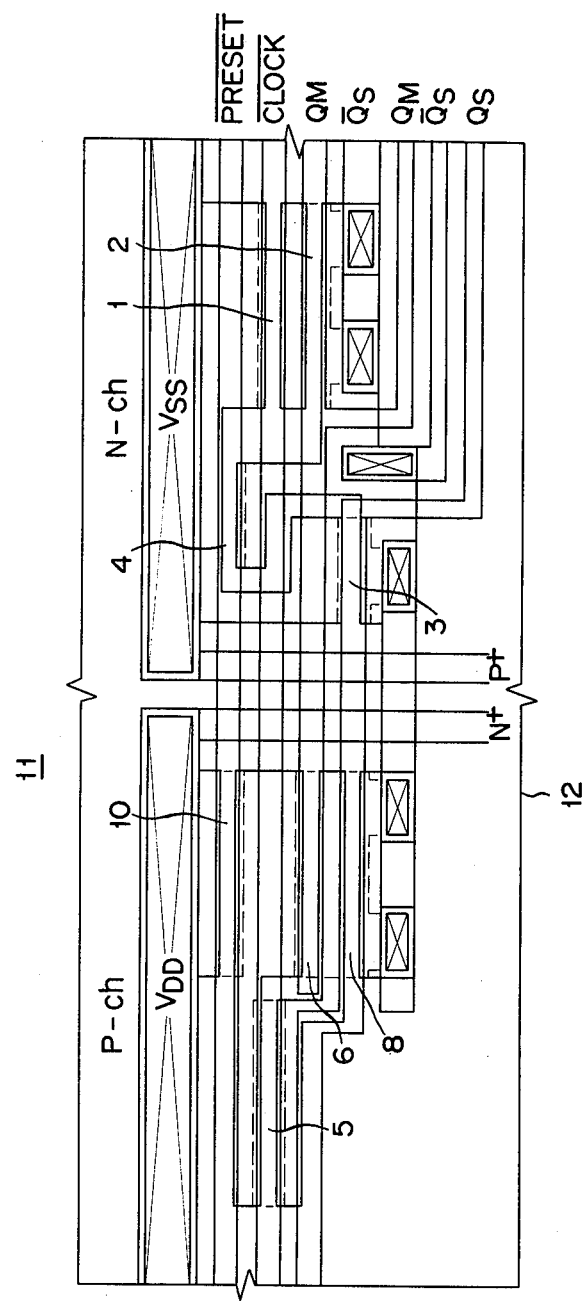
FIG. 3 is a plan view of a pattern defined by the circuit of FIG. 2 when integrated.
Figure 4:
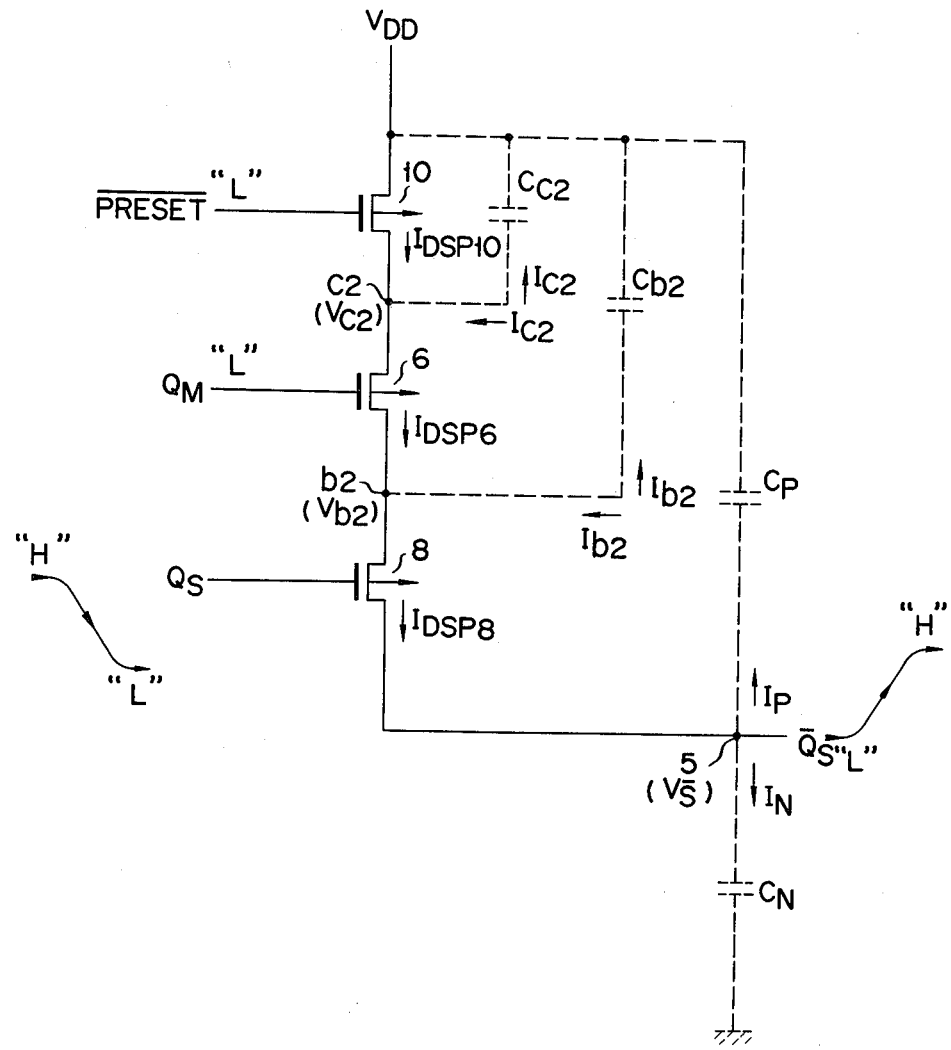
FIG. 4 indicates a circuit arrangement derived from the analysis of the circuit of FIG. 3.
Figure 5:
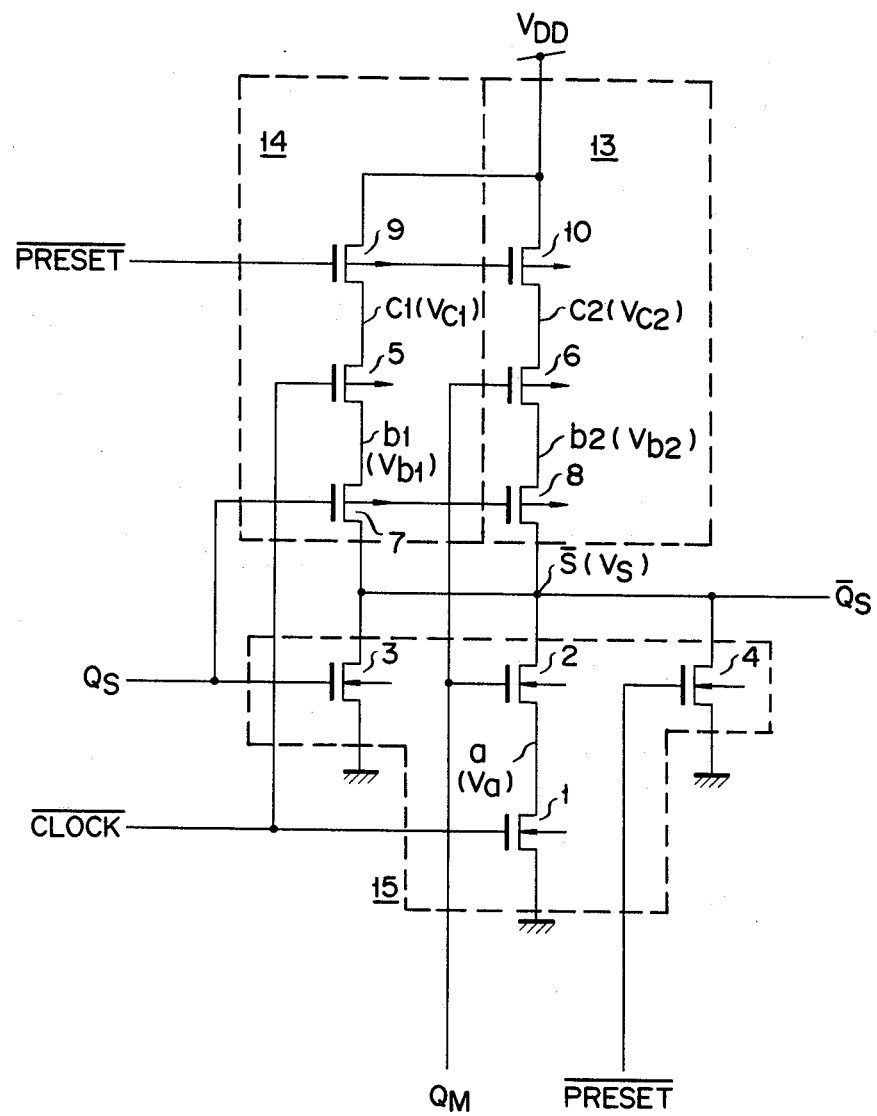
FIG. 5 shows the arrangement of a semiconductor integrated circuit device according to one embodiment of this invention.
Figure 6:
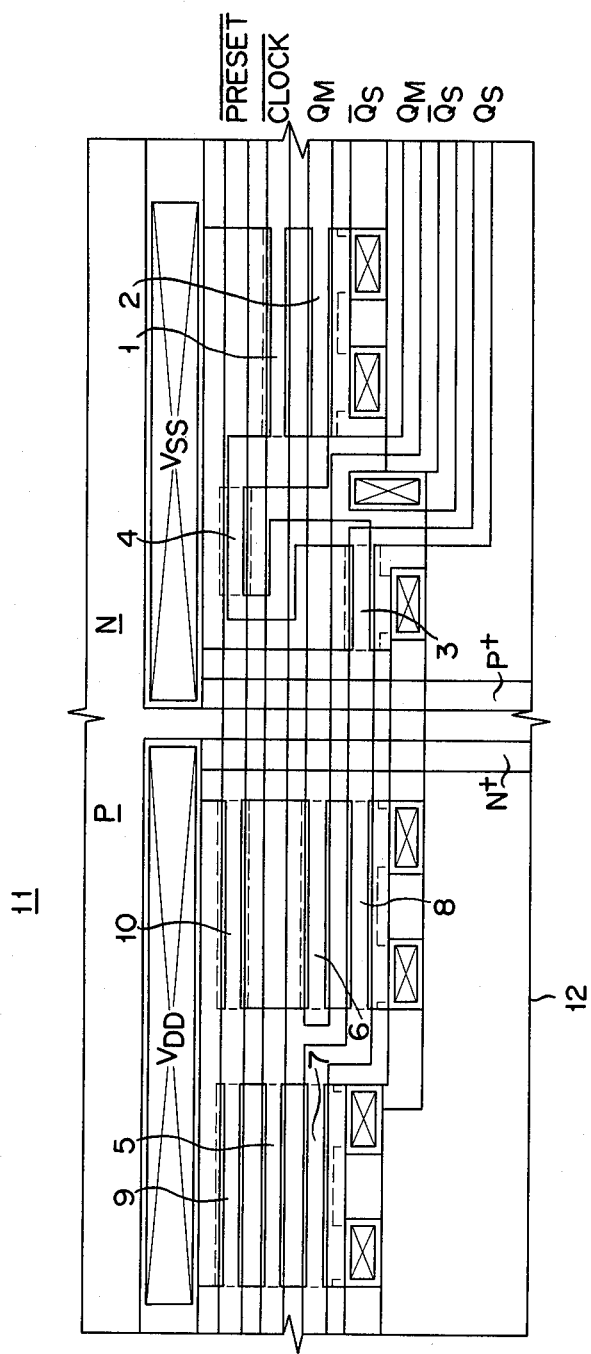
FIG. 6 is a plan view of a pattern defined by the circuit of FIG. 5 when integrated.
Figure 7:
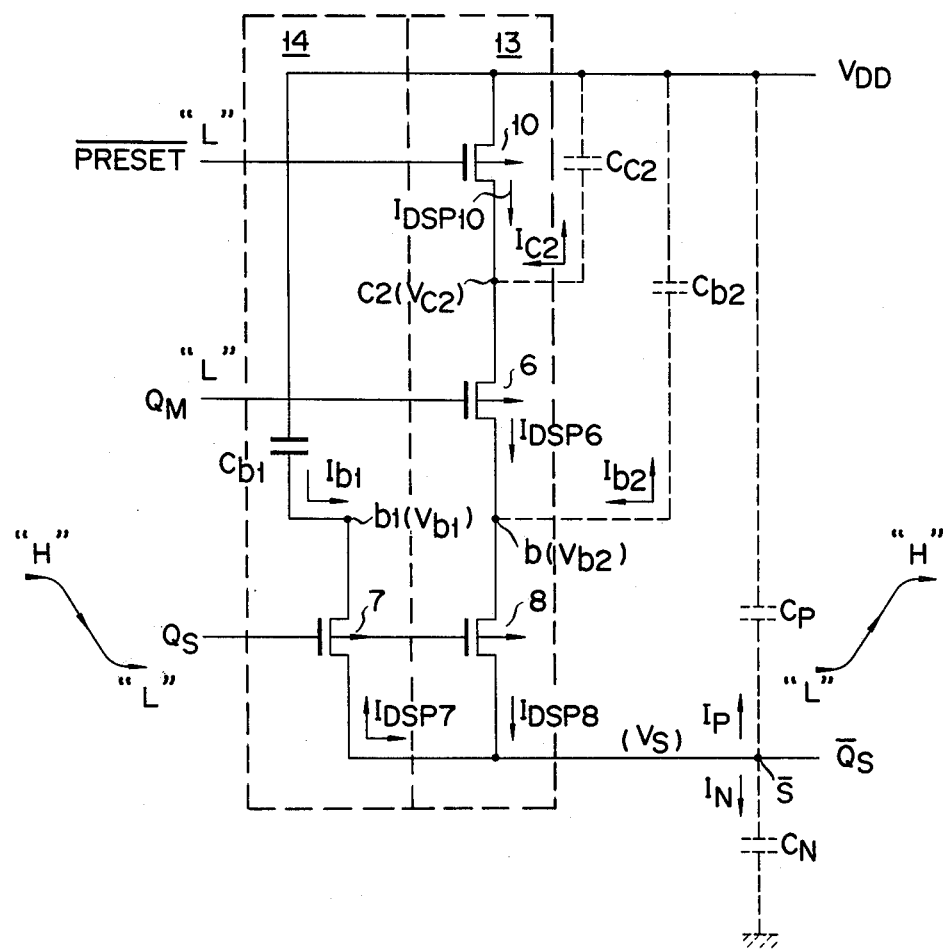
FIG. 7 illustrates a circuit arrangement derived from the analysis of the circuit of FIG. 6.

There will now be described by reference to FIGS. 5 to 8 a semiconductor integrated circuit device embodying this invention for better understanding of the object and arrangement claimed by the invention. FIGS. 5, 6 and 7 correspond to FIGS. 2, 3 and 4 given to describe the prior art semiconductor integrated circuit device. The arrangement and effect of the invention will be apparent from comparison between the semiconductor integrated circuit devices of the invention and the prior art.

The transistors 5, 6 included in a semiconductor integrated circuit device embodying this invention are not provided with a common source and a common drain as in the case with the transistors 5, 6 of FIGS. 2 and 3 used in the prior art. Instead, the integrated circuit device of the invention comprises a series circuit including the transistor 5 connected between the first voltage supply terminal $V_{DD}$ and output terminal $\overline{Q_S}$. This new series circuit is provided with a transistor 9 having a common gate with the transistor 10, and also with a transistor 7 similarly having a common gate with the transistor 8.

A semiconductor integrated circuit device according to one embodiment of this invention comprises, as seen from FIG. 5, a first voltage supply terminal $V_{DD}$, output terminal $\overline{Q_S}$ and second voltage supply terminal (earth) to form an AND-NOR circuit. Connected between the first voltage supply terminal $V_{DD}$ and output terminal $\overline{Q_S}$ are a first series circuit 13 formed of P channel transistors 10, 6, 8 and a second series circuit 14 formed of P channel transistors 9, 5, 7. The gates of these transistors are supplied with signals $\overline{Preset}$, $Q_M$, $Q_S$, $\overline{CLOCK}$. Further, the transistors 9, 10, 7, 8 are supplied with the same signal. An output capacitor (not shown) is formed between the second voltage supply terminal (earth) and output terminal $\overline{Q_S}$. Said capacitor may be separately provided. Where, however, an integrated arrangement is taken into account, it is possible to utilize a junction capacitor. A circuit 15 for discharging electric energy stored in the above-mentioned capacitor is connected between the second voltage supply terminal (earth) and output terminal $\overline{Q_S}$. This circuit 15 may be of any type, provided it has a certain degree of resistivity. Connected to the circuit 15 are N channel transistors 1, 2, 3, 4 of the AND-NOR circuit which are complementary to the P channel transistors 5, 6, 7, 8, 9, 10. When assembled into a full scale device shown in FIG. 6, a semiconductor integrated circuit arranged as described above displays its effect.

With the integrated circuit device of FIG. 6, any other section than the first and second voltage supply terminals $V_{DD}$, $V_{SS}$ (earth) and output terminal $\overline{Q_S}$ does not contain a common source region and common drain region defined by the assembly of transistors constituting parallel circuits. Therefore, it is possible to decrease the number of junction capacitors having a common region, as seen from the relationship between the transistor 5 and the transistors 8, 6, 10 of FIG. 2.

Figure 8:
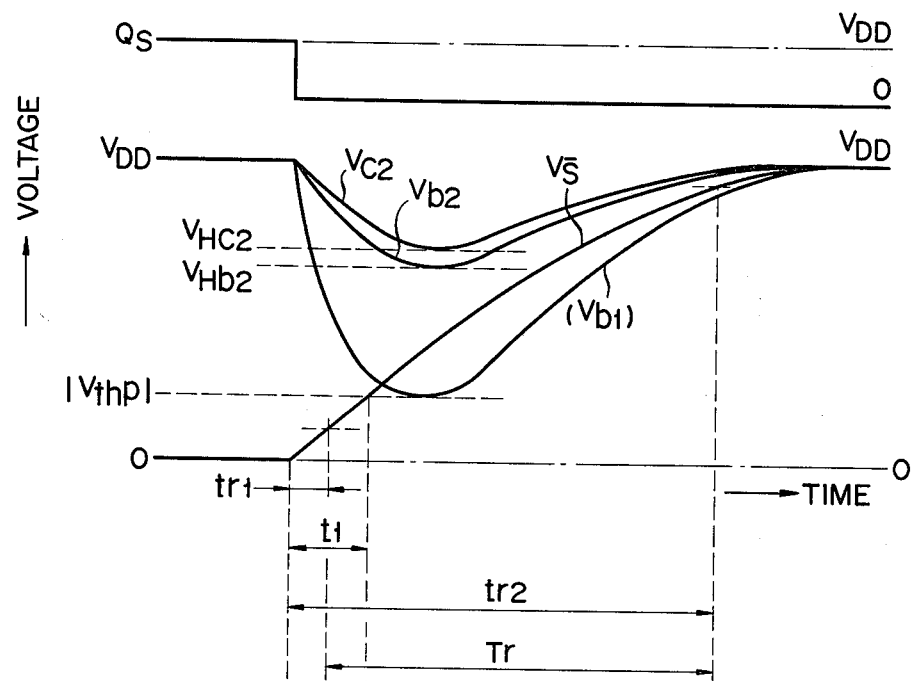
FIG. 8 is an operative waveform chart of voltages impressed at the respective nodes of the circuit of FIG. 7.

With an integrated circuit device arranged as described above, provision of transistors 7, 10 reduces the magnitude of capacitors formed at the nodes b2, c2 and consequently the resistance resulting from the diffusion of elements. As seen, therefore, from the circuit of FIG. 7 formed for analysis of the condition in which electric energy is charged, it is possible to extremely reduce a length of time required for node currents $I_{b2}$, $I_{c2}$ to be charged or discharged. As a result, output capacitors $C_P$, $C_N$ are saved from a noncharged condition which formerly occurred in the initial stage of the charge characteristic in the prior art semiconductor integrated circuit device. Thus voltages $V_{b2}$, $V_{c2}$, $V_{\overline{S}}$ impressed at the nodes b2, c2, $\overline{S}$ of FIG. 7 can be made to have such a level as illustrated in FIG. 8. Since the junction capacitors at the nodes b2, c2 have been decreased in magnitude, the levels of the above-mentioned voltages $V_{b3}$, $V_{c2}$, $V_{\overline{S}}$ can quickly rise back to the original state. The notations given in FIG. 8 denote the following:

$t_{r1}$: a length of time required for the voltage $V_{\overline{S}}$ to reach 10% ($V_S = 0.1 \times V_{DD}$) of an amplitude ($0 \sim V_{DD}$)

$t_1$: a length of time required for the voltage $V_{\overline{S}}$ to reach a P−ch threshold voltage ($V_{\overline{S}} = |V_{thP}|$)

$t_{r2}$: a length of time required for the voltage $V_{\overline{S}}$ to reach 90% ($V_{\overline{S}} = 0.9 \times V_{DD}$)

$t_r$: a length of time required for the levels of the voltages $V_{b2}$, $V_{c2}$, $V_{\overline{S}}$ to rise back to the original state, namely, $t_r = t_{r2} - t_{r1}$.

With an integrated circuit device arranged as shown in FIG. 5, a line through which the output capacitors $C_P$, $C_N$ are charged is constituted by the first series circuit 13 and second series circuit 14 of FIG. 7, said capacitors $C_P$, $C_N$ can be quickly charged.

Therefore, a semiconductor integrated circuit device according to the foregoing embodiment of this invention in which capacitors at the respective nodes have been reduced in magnitude can have the AND-NOR logic circuit improved in the rising characteristic and therefore be accelerated in operation.

There will now be described by reference to FIGS. 9 to 12 a semiconductor integrated circuit device according to another embodiment of the invention. FIGS. 9, 10, 11 and 12 correspond to FIGS. 5, 6, 7 and 8 associated with the first embodiment. Comparison between the respective corresponding figures will clearly show the advantage of said another embodiment over the first embodiment.

Figure 9:
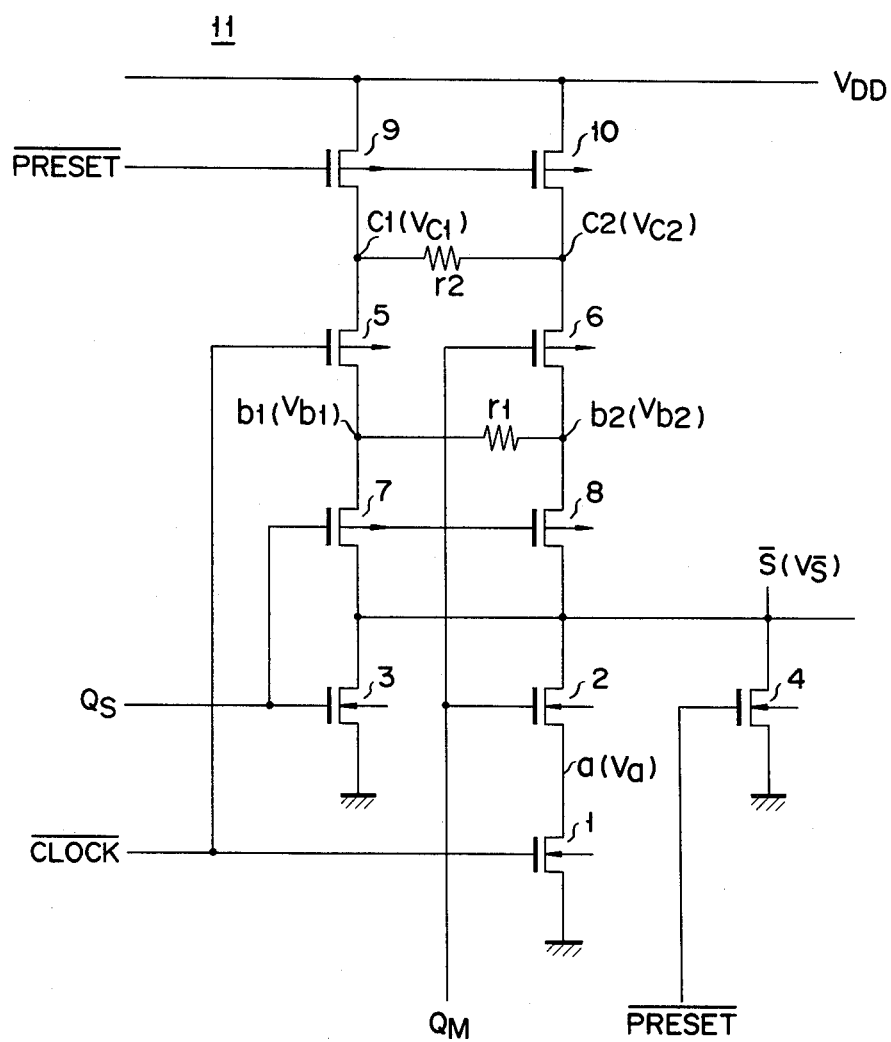
FIG. 9 sets forth the arrangement of a semiconductor integrated circuit device according to another embodiment of the invention.

The embodiment of FIG. 9 has substantially the same arrangement as that of FIG. 5. The only difference is that with the second embodiment of FIG. 9, among the transistors constituting the AND-NOR circuit 11, two pairs of parallel connected transistors 7-8, 9-10, each have a common gate electrode; the source or drain electrodes of the respective pairs of electrodes are used in common; a common resistor r1 connects the remaining drain or source electrodes of one pair of transistors 7-8; and a common resistor r2 connects the remaining drain or source electrodes of another pair of transistors 9-10.

Figure 10:
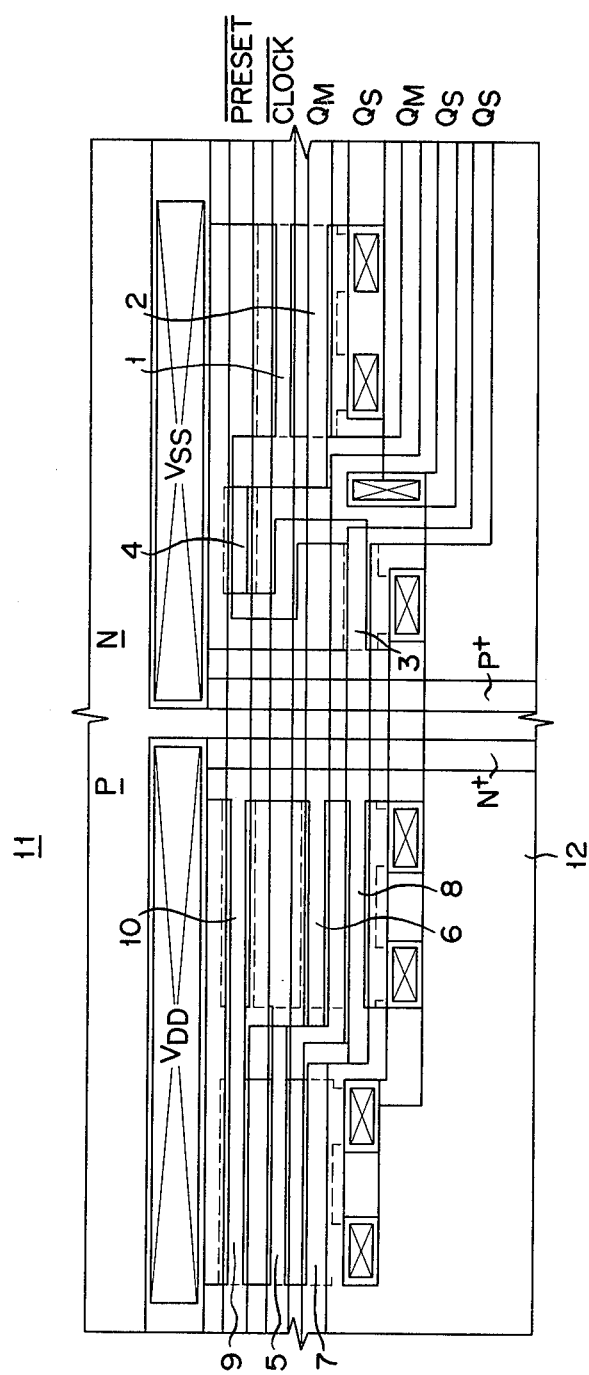
FIG. 10 is a plan view of a pattern defined by the circuit of FIG. 9 when integrated.
Figure 11:
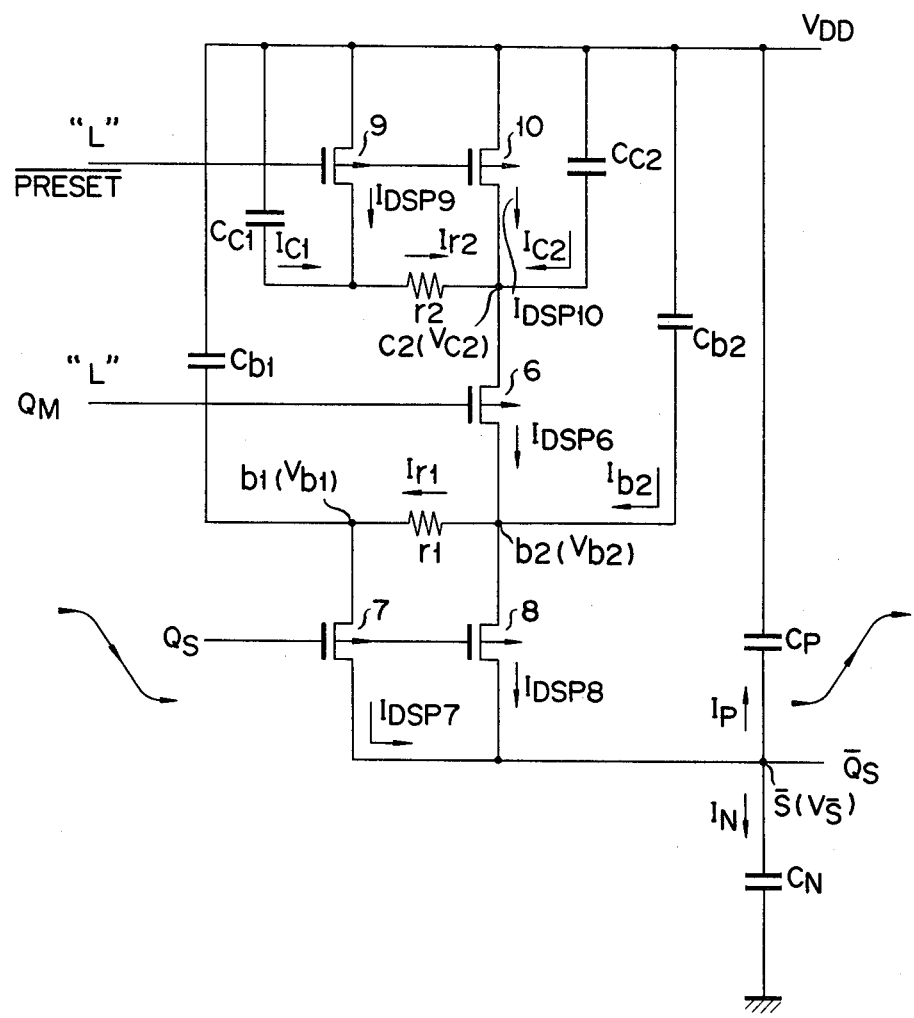
FIG. 11 shows a circuit arrangement derived from the analysis of the circuit of FIG. 10.

As seen from FIG. 10, the second embodiment is characterized in that the diffused regions at nodes b1, b2 of one pair of transistors 7, 8 (of the so-called common gate type) are connected by a P+ type diffused conductor; and the diffused regions at nodes c1, c2 of another pair of transistors 9, 10 (similarly of the so-called common gate type) are connected by a P+ type diffused conductor. The reason why the circuit arrangement of FIG. 10 is adopted will become apparent from a circuit arrangement of FIG. 11 derived from the analysis of FIG. 10. FIG. 11 shows that with one pair of transistors 7, 8, whose gate electrodes or drain electrodes are used in common, the remaining drain or gate electrodes are connected by a common resistor r1. This arrangement enables node voltage $V_{b1}$ at node b1 of the transistor 7 to be impressed under exactly the same condition relative to the power source voltage $V_{DD}$ as in the case of the transistor 8. As a result, the leakage current $I_{DSP7}$ which formerly flowed back from the output capacitors $C_P$, $C_N$ completely ceases to run by causing the voltage $V_{\overline{S}}$ of the drain electrode of the transistor 7 always to have a level expressed as $V_{b1} > V_{\overline{S}}$ relative to the voltage $V_{b1}$ of the source electrode of said transistor 7. The above-mentioned arrangement has further advantage that the output capacitors $C_P$, $C_N$ can be charged with electric energy through two transistors 7, 8.

Now let it be assumed that the P channel transistor 7 has the same mutual conductance gm as the P channel transistor 8. Then even where a slight difference arises between the levels of the voltages $V_{b1}$, $V_{b2}$ at nodes b1, b2 (that is, $V_{b1} < V_{b2}$ because of the leakage current $I_{DSP6}$), the resistance of the resistor r1 can be reduced to a minimum level (assuming the specific resistance $\rho_S$ of the diffused region P+ of FIG. 10 to be $150\Omega\square$, then $$150 \ \Omega \times \frac{38}{8} \simeq 712.5 \ \Omega).$$

After the appearance of the previously described equilibrium phenomenon, the node voltage $V_{b1}$ increases with the node voltage $V_{b2}$. In this case, a resistance component does not raise any considerable problem. With the second embodiment of the invention of FIGS. 9 to 12, the mutual conductance gm of the P channel transistors 7, 8 directly contributes to the rising characteristic of the AND-NOR logic circuit, which can be best improved through adjustment of said mutual conductance. Therefore, the semiconductor integrated circuit device according to the second embodiment of the invention can be operated at a twice higher speed than the prior art.

Referring to FIG. 11, the gate electrodes and source electrodes of the transistors 9, 10 are respectively used in common. The remaining drain electrodes of said transistors 9, 10 are connected together by a common resistor r2. The reason why the respective electrodes of the transistors 9, 10 are connected by common elements as described above is that it is intended to decrease the length of time required for the level of voltage $V_{c2}$ at node c2 to regain the original level after the appearance of the equilibrium phenomenon. Where the drain electrodes of the P channel transistors 9, 10 are connected by a common resistor r2 as mentioned above, a capacitor at node c2 can be charged with electric energy through said two P channel transistors 9, 10. As a result, the node voltage $V_{c2}$ at node c2 naturally exerts a great effect on the magnitude of leakage current $I_{DSP6}$, thereby contributing to the reduction of the length of time required for the level of the node voltage $V_{b2}$ at node b2 to regain the original level. Eventually, the P channel transistors 9, 10 assist in shortening the length of time required for the node voltage $V_{b2}$ to regain the original level, thereby improving the rising characteristic of an output signal from the AND-NOR logic circuit. The various circuits of the second embodiment are operated in the same manner as in the prior art, description thereof being omitted. However, the respective transistors included in the second embodiment are operated as follows:

o The P channel transistors 6, 9, 10 never fail to be operated in an unsaturated state.

o The P channel transistors 7, 8 are operated in a saturated state in case of $0 \leq V_{\bar{S}} \leq |V_{thP}|$, and in an unsaturated state in case of $|V_{thP}| < V_{\bar{S}} \leq V_{DD}$.

Figure 12:
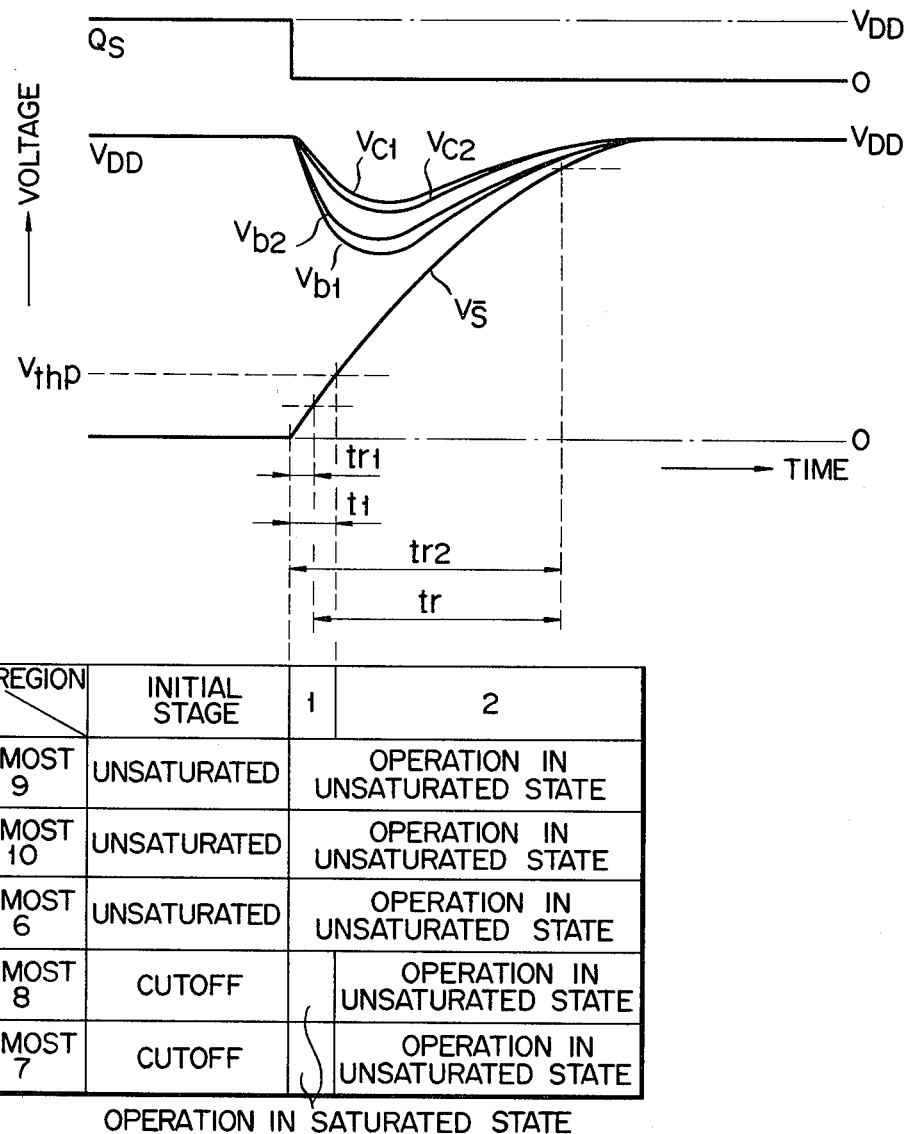
FIG. 12 is an operative waveform chart of voltages impressed at the respective nodes of the circuit of FIG. 10.

According to the second embodiment of this invention, the levels of voltages at nodes b1, b2, c1, c2 vary as shown in the waveforms of FIG. 12. As seen from FIG. 12, a length of time $t_r$ required for the levels of the voltages $V_{b1}$, $V_{b2}$, $V_{c1}$, $V_{c2}$ at nodes b1, b2, c1, c2 to rise back to the original state is far more noticeably reduced than in the prior art, distinctly proving the effect of the second embodiment.

With the foregoing embodiments of the invention, output capacitors are charged with electric energy through all transistors respectively provided with a common gate. This means that a semiconductor integrated circuit device can be operated at such a high speed as N×gm corresponding to a number N of transistors whose gates are used in common.

The aforesaid embodiments of the invention wherein the logic circuit is formed of two or more circuits such as AND circuit, NOR circuit, etc. comprise a plurality of pairs of parallel connected transistors, for example, a pair of transistors 7, 8 and a pair of transistors 9, 10 which are respectively of the common gate type. As a result, a capacitor at each node can be charged with electric energy through a plurality of pairs of transistors. Application of the above-mentioned plural pairs of transistors is an important requirement for the higher acceleration of the operation of an integrated circuit.

With the above-mentioned embodiments, it is possible to use not only the previously described means but also aluminium or polysilicon to connect the transistors of each pair. Where a conductor is diffused, this invention enables the condition of diffusion to be freely adjusted in consideration of the relationship between said diffusion and the mutual conductance gm of the P channel transistors 7, 8, 9, 10. Therefore, it is possible to diffuse the so-called P− of P+ region.

Figure 13:
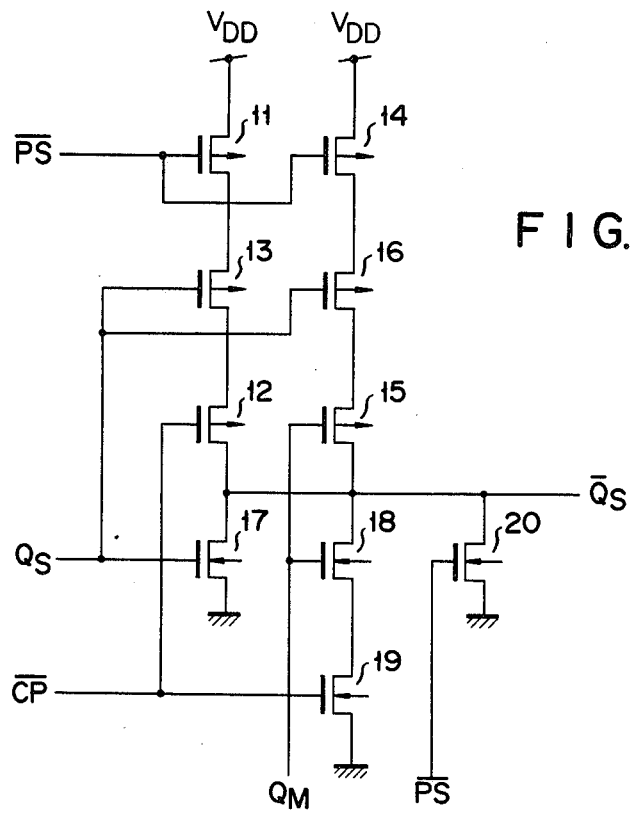
FIG. 13 sets forth the arrangement of a semi-conductor integrated circuit device according to still another embodiment.
Figure 14:
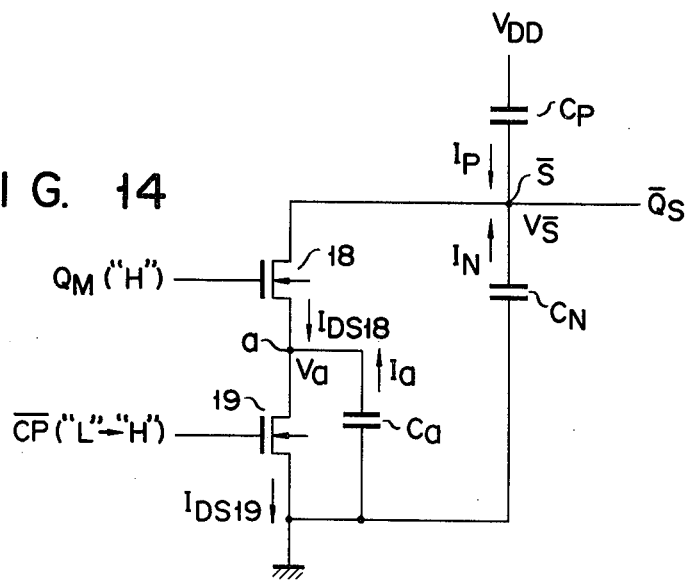
FIG. 14 typically indicates the operation of the circuit arrangement of FIG. 13.

There will now be described by reference to FIGS. 13 to 16 a semiconductor integrated circuit device according to still another embodiment of this invention. FIG. 13 shows the arrangement of a MOS type semiconductor integrated circuit device embodying the invention. FIG. 13 shows part of a flip-flop circuit. A difference between the circuit arrangement of FIG. 13 and that of FIG. 5 is that a P-MOS transistor 12 of FIG. 13 (corresponding to the transistor 5 of FIG. 5) which is supplied with a clock pulse $\overline{CP}$ and a P-MOS transistor 13 of FIG. 13 (corresponding to the transistor 7 of FIG. 5) which is supplied with a signal $\overline{Q_S}$ have been changed in place from said corresponding transistors 5, 7 of FIG. 5; and consequently a P-MOS transistor 15 of FIG. 13 (corresponding to the transistor 6 of FIG. 5) and a P-MOS transistor 16 of FIG. 13 (corresponding to the transistor 8 of FIG. 5) also occupy different positions from those of said corresponding transistors 6, 8 of FIG. 5. In other words, three P-MOS transistors 11, 13, 12 and one N-MOS transistor 17 are connected in series in the order mentioned between the power supply voltage terminal $V_{DD}$ and power supply voltage terminal $V_{SS}$ (earth). Similarly, three P-MOS transistors 14, 16, 15 and two N-MOS transistors 18, 19 are connected in series in the order mentioned between the power supply voltage terminal $V_{DD}$ and power supply voltage terminal $V_{SS}$ (earth). The drains of the two P-MOS transistors 12, 15 are connected together by a common line. An N-MOS transistor 20 is connected between said common line and the power supply voltage terminal $V_{SS}$ (earth).

There will now be described the operation of the above-mentioned circuit arrangement according to a third embodiment of FIGS. 13 to 16. Now, reference is made to the fall of a signal $\overline{Q_S}$ from the high level "H" to the low level "L". At the time of this fall, a P-MOS transistor 15 supplied with a signal $Q_M$ having a high level "H" is rendered nonconducting. A P-MOS transistor 12 supplied with a clock pulse $\overline{CP}$ whose level has been reversed from the low state "L" to the high state "H" is also rendered nonconducting. Therefore, these P-MOS transistors 15, 12 do not practically contribute to improvement on the falling characteristic of the above-mentioned signal $\overline{Q_S}$. Therefore, the falling characteristic of the signal $\overline{Q_S}$ may be typically represented by FIG. 14. Where Kirchhoff's law is applied to the junctions $\overline{S}$, a of FIG. 14, then the following equations result:

$$I_P(\text{charged current}) + I_M(\text{discharged current}) = I_{DS18}(\text{saturated or unsaturated current}) \quad (1)$$

$$I_{DS18}\begin{pmatrix}\text{saturated or}\\\text{unsaturated current}\end{pmatrix} + I_a\begin{pmatrix}\text{discharged}\\\text{current}\end{pmatrix} = \quad (2)$$

$$I_{DS19}(\text{unsaturated current})$$

In case of $V_{DD} \geq V_{\bar{S}} \geq V_{DD} - V_{thN}$, $I_{DS18}$ denotes saturated current. In case of $V_{DD} - V_{thN} > V_{\bar{S}} \geq 0$, $I_{DS18}$ represents unsaturated current. When analyzed by the divisional mensuration method, the above current equations may be rewritten as follows:

$$I_P(\text{charged current}) = \frac{d}{dt}\{C_P(V_{DD} - V_{\bar{S}})\} = \quad (3)$$

$$\frac{d}{dV_{\bar{S}}}\{C_P(V_{DD} - V_{\bar{S}})\}\frac{dV_{\bar{S}}}{dt} = \frac{d}{dV_{\bar{S}}}\left\{\left(\frac{A_P}{\sqrt{V_{DD} - V_{\bar{S}} + \alpha_P}} + \right.\right.$$

$$\left.C_{linear}\right)(V_{DD} - V_{\bar{S}})\left.\right\}\frac{dV_{\bar{S}}}{dt} = -\left[\frac{A_P}{2\sqrt{V_{DD} - V_{\bar{S}} + \alpha_P}} + \right.$$

$$\left.\frac{A_P \cdot \alpha_P}{2(\sqrt{V_{DD} - V_{\bar{S}} + \alpha_P})^3} + C_{linear}\right]\frac{dV_{\bar{S}}}{dt}$$

-continued
$$I_N \text{ (discharged current)} = \qquad (4)$$

$$-\frac{d}{dt}\{C_N \cdot V_{\bar{S}}\} = -\frac{d}{dV_{\bar{S}}}\{C_N \cdot V_{\bar{S}}\}\frac{dV_{\bar{S}}}{dt} =$$

$$-\frac{d}{dV_{\bar{S}}}\left\{\left(\frac{A_N}{\sqrt{V_{\bar{S}}+\alpha_N}}+C_{linear}\right)V_{\bar{S}}\right\}\frac{dV_{\bar{S}}}{dt} =$$

$$-\left[\frac{A_N}{2\sqrt{V_{\bar{S}}+\alpha_N}}+\frac{A_N \cdot \alpha_N}{2(\sqrt{V_{\bar{S}}+\alpha_N})^3}+C_{linear}\right]\frac{dV_{\bar{S}}}{dt} \qquad (5)$$

$$I_{DS18} \text{ (saturated current)} = K_{18}\{V_{DD} - V_a - V_{thN}\}^2 \frac{L_N}{L_N - L'_N}$$

where:
$K_{18}$ = a constant
$L_N$ = channel length $L'_N$ = modulated channel length, that is, $$\sqrt{C(|V_{thP}| - V_{\bar{S}})} \text{ (where } C \text{ is a constant)}$$

$$I_{DS18} \text{ (unsaturated current)} = \qquad (6)$$
$$K_{18}\{(V_{DD} - V_a - V_{thN})(V_{\bar{S}} - V_a) - (V_{\bar{S}} - V_a)^2\}$$

$$I_a \text{ (discharged current)} = -\frac{d}{dt}\{C_a \cdot V_a\} = \qquad (7)$$

$$-\frac{d}{dV_a}\left\{\frac{A_a}{\sqrt{V_a+\alpha_N}}+C_{linear}\right\}\frac{dV_a}{dt} =$$

$$-\left[\frac{A_a}{2\sqrt{V_a+\alpha_N}}+\frac{A_a \cdot \alpha_N}{2(\sqrt{V_a+\alpha_N})^3}+C_{linear}\right]\frac{dV_a}{dt}$$

$$I_{DS19} \text{ (unsaturated current)} = K_{19}\{(V_{DD} - V_{thN})V_a - V_a^2\} \qquad (8)$$
(where $K_{19}$ is a constant)

In case of $V_{DD} \geq V_{\bar{S}} > V_{DD} - V_{thN}$, therefore, the following equations are derived from the above equation (5):

$$-\left[\frac{A_P}{2\sqrt{V_{DD}-V_{\bar{S}}+\alpha_P}}+\frac{A_P \cdot \alpha_P}{2(\sqrt{V_{DD}-V_{\bar{S}}+\alpha_P})^3}+\right. \qquad (9)$$

$$\left.\frac{A_N}{2\sqrt{V_{\bar{S}}+\alpha_N}}+\frac{A_N \cdot \alpha_N}{2(\sqrt{V_{\bar{S}}+\alpha_N})^3}+C_{linear}\right]\frac{dV_{\bar{S}}}{dt} =$$

$$K_{18}\{V_{DD} - V_a - V_{thN}\}^2 \frac{L_N}{L_N - L'_N}$$

$$-\left[\frac{A_a}{2\sqrt{V_a+\alpha_N}}+\frac{A_a \cdot \alpha_N}{2(\sqrt{V_a+\alpha_N})^3}+C_{linear}\right]\frac{dV_a}{dt} = \qquad (10)$$

$$K_{19}\{(V_{DD} - V_{thN})V_a - V_a^2\} -$$

-continued
$$K_{18}\{V_{DD} - V_a - V_{thN}\}^2 \frac{L_N}{L_N - L'_N}$$

Consequently, with a voltage at junction $\bar{S}$ taken to be $V_{\bar{S}}^{(m)}$ at time of $t = m\Delta t_{\bar{S}}$ and a voltage at junction a taken to be $V_a^{(n)}$ at time of $t = n\Delta t_a$, then the following equations result:

$$\begin{cases} dV_{\bar{S}} = \Delta V_S = V_{\bar{S}}^{(m+1)} - V_{\bar{S}}^{(m)} & (11) \\ dt = \Delta t = (m+1)\Delta t_{\bar{S}} - m\Delta t_{\bar{S}} = \Delta t_{\bar{S}} & (12) \end{cases}$$

$$\begin{cases} dV_a = \Delta V_a = V_a^{(n+1)} - V_a^{(n)} & (13) \\ dt = \Delta t = (n+1)\Delta t_a - n\Delta t_a = \Delta t_a & (14) \end{cases}$$

Assuming $\Delta t_{\bar{S}} > t_a$, $\Delta t_{\bar{S}} = P\Delta t_a$ (where P is a natural number), $V_{\bar{S}}^{(m+1)}$ and $V_a^{(n+1)}$ may be expressed as follows by the based on the divisional mensuration method:

$$V_{\bar{S}}^{(m+1)} = \qquad (15)$$

$$V_{\bar{S}}^m + \frac{\Delta t_{\bar{S}}}{M(V_{\bar{S}}^m)}\left[K_{18}\{V_{DD} - V_a^n - V_{thN}\}^2 \frac{L_N}{L_N - L'_N}\right]$$

where:
$M(V_{\bar{S}}^m) =$ $$-\left[\frac{A_P}{2\sqrt{V_{DD}-V_{\bar{S}}^m+\alpha_P}}+\frac{A_P \cdot \alpha_P}{2(\sqrt{V_{DD}-V_{\bar{S}}^m+\alpha_P})^3}+\right.$$

$$\left.\frac{A_N}{2\sqrt{V_{\bar{S}}^m+\alpha_N}}+\frac{A_N \cdot \alpha_N}{2(\sqrt{V_{\bar{S}}^m+\alpha_N})^2}+C_{linear}\right]$$

$$L'_N = \sqrt{C\{|V_{thP}| - V_{\bar{S}}^m\}}$$

$V_{\bar{S}}(0) = V_{DD}$ (initial value)
$(\Delta t_S)/(\Delta t_a) = P$ (P is a given natural number)
$m = 0, 1, 2, \ldots$ $$V_a^{(n+1)} = V_a^n + \frac{\Delta t_a}{N(V_a^n)}\left[K_{19}\{(V_{DD} - V_{thN})V_a^n - (V_a^n)^2\} -\right. \qquad (16)$$

$$\left. K_{19}\{V_{DD} - V_a^n - V_{thN}\}^2 \frac{L_N}{L_N - L'_N}\right]$$

where:

$$N(V_a^n) = -\left[\frac{A_a}{2\sqrt{V_a^n+\alpha_N}}+\frac{A_a \cdot \alpha_N}{2\sqrt{V_a^n+\alpha_N}}+C_{linear}\right]$$

$V_a(0) = V_{DD} - V_{thN}$ (initial value)

$n = 0, 1, 2, \ldots$
In case of $V_{DD} - V_{thN} > V_{\bar{S}} \geq 0$, however, the aforesaid equation (6) is applied.

With the circuit arrangement of the first embodiment of FIG. 5, the above-mentioned equation (15) may be rewritten as follows:

$$V_{\bar{S}}^{(m+1)} =$$

$$V_{\bar{S}}^m + \frac{\Delta t_{\bar{S}}}{M(V_{\bar{S}}^m)} \left[ K_{18}\{V_{DD} - V_a^m - V_{th}\}^2 \frac{L_N}{L_N - L'_N} - \right.$$

$$K_{18}\{(V_{b1}{}^l - V_{\bar{S}}^m)V_{b1}{}^l - (V_{b1}{}^l)^2\} -$$

$$\left. K_{16}\{(V_{b2}{}^l - V_{\bar{S}}^m)V_{b2}{}^l - (V_{b2}{}^l)^2\} \right]$$

With the semiconductor integrated circuit device of the third embodiment of FIGS. 13 to 16, a term denoting a variation which is given in the above equation has a larger denominator, causing an output signal from the AND-NOR logic circuit to fall at a greater inclination. With the third embodiment of FIGS. 13 to 16, therefore, the level of the voltage $V_{\bar{S}}$ at the junction $\bar{S}$ falls at a greater inclination, that is, fall to the zero level more quickly than in the first embodiment of FIG. 5.

FIG. 15 collectively shows on the basis of the foregoing discussion the operating conditions of the transistors included in the circuit of the third embodiment of FIG. 13 when the signal $\overline{Q_S}$ falls. FIG. 16 indicates changes in the levels of the voltages $V_a$, $V_{\bar{S}}$ at the junctions a, $\bar{S}$ resulting from the operating conditions shown in FIG. 15. The region 1 of FIG. 16 denotes the range in which the voltage $V_{\bar{S}}$ at the junction $\bar{S}$ falls from the level $V_{DD}$ down to the level $V_{DD}-V_{thN}$. The region 2 of FIG. 16 indicates the range in which said voltage $V_{\bar{S}}$ further falls from the level $V_{DD}-V_{thN}$ down to the proximity of the level $V_{SS}^{(0)}$(earth).

Figure 17:
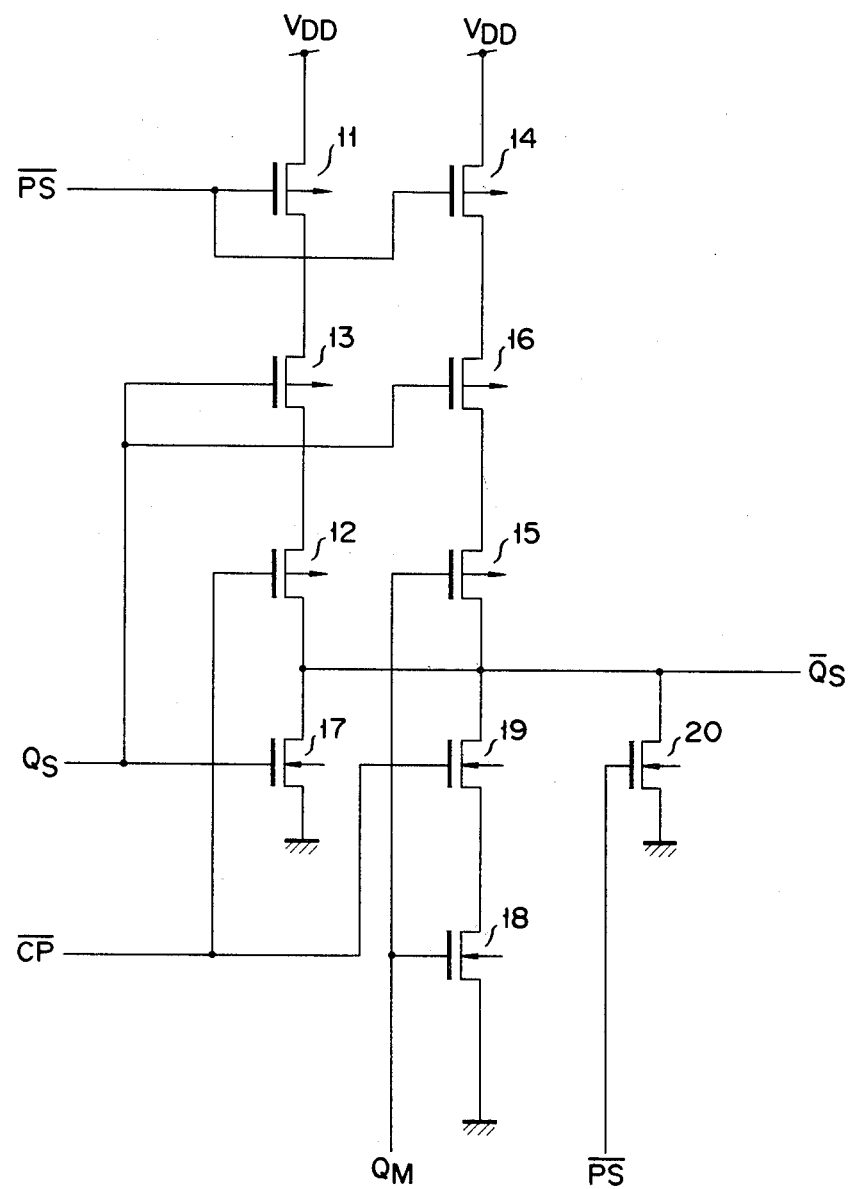
FIG. 17 shows the arrangement of a semiconductor integrated circuit device according to still another embodiment of the invention.
Figure 18:
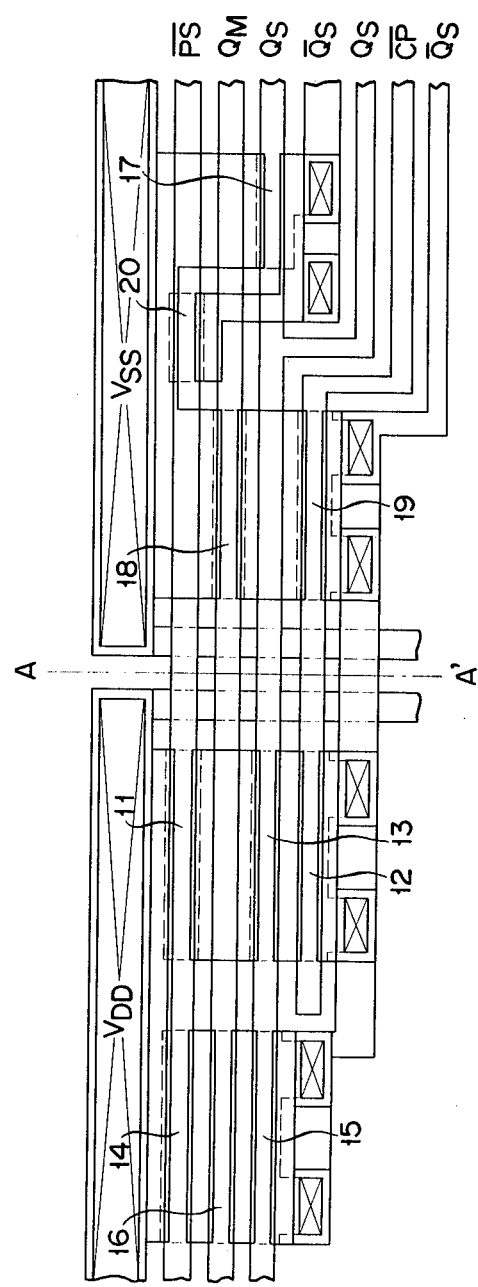
FIG. 18 is a plan view of a pattern defined by the circuit of FIG. 17 when integrated.

There will now be described by reference to FIG. 17 a semiconductor integrated circuit device according to a fourth embodiment of this invention. With the preceding third embodiment, the P-MOS transistor 12 supplied with a clock pulse $\overline{CP}$ and the P-MOS transistor 13 supplied with a signal $Q_S$ both provided on the P channel side had their positions exchanged for each other. Namely, the P-MOS transistor 12 was set close to that side on which the signal $\overline{Q_S}$ was received, thereby attempting to accelerate the speed at which the signal $\overline{Q_S}$ falls. However, the above-mentioned exchange of the positions of the P-MOS transistors 12, 13 on the P channel side alone results in complicated wiring and an increase in the entire chip size. With the fourth embodiment of FIG. 17, therefore, the positions of the N-MOS transistor 18 supplied with a signal $Q_M$ and the N-MOS transistor 19 supplied with a clock pulse $\overline{CP}$ both disposed on the N channel side are exchanged. Namely, the N-MOS transistor 19 is set close to that side on which the signal $\overline{Q_S}$ is received. FIG. 18 illustrates a pattern appearing on the semiconductor integrated circuit device according to the fourth embodiment of FIG. 17. With the line A—A' of FIG. 18 taken as a border, P-MOS transistors are provided on the left side of FIG. 18, and N-MOS transistors are set on the right side thereof. As easily seen, the pattern of FIG. 18 has substantially the same size as in the prior art. As in the foregoing embodiments, the P-MOS transistors used in the fourth embodiment of FIG. 17 do not practically contribute to improvement on the falling characteristic of the signal $\overline{Q_S}$. Therefore, the falling characteristic of the signal $\overline{Q_S}$ may be typically represented by the circuit arrangement of FIG. 19. With the preceding third embodiment of FIGS. 13 to 16, the current of the capacitor $C_a$ was only used for discharge. With the fourth embodiment of FIG. 17, however, the voltage $V_a$ at the junction a initially has a zero level. Therefore, the current of the capacitor $C_a$ is first used for charge but later for discharge.

Figures 19, 20:
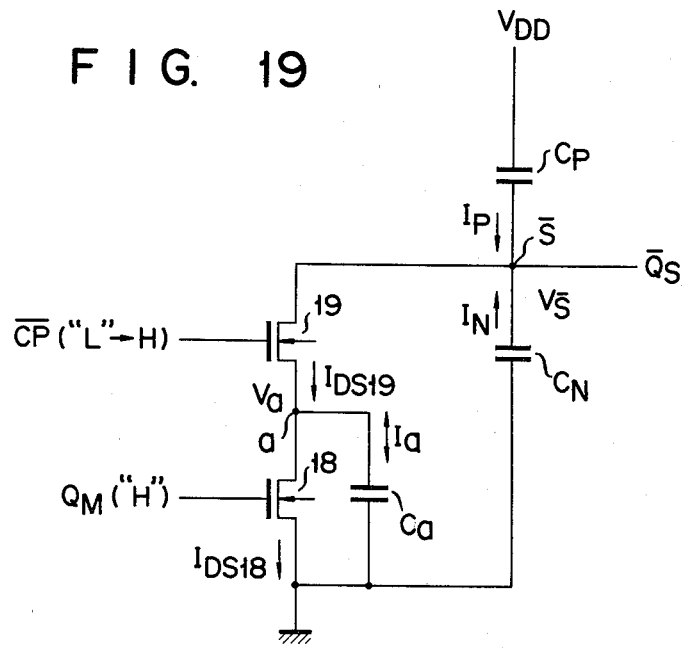
FIG. 19 typically shows the operation of the circuit arrangement of FIG. 18.
FIG. 20 is a chart showing the operating condition of the circuit arrangement of FIG. 18.
Figure 21:
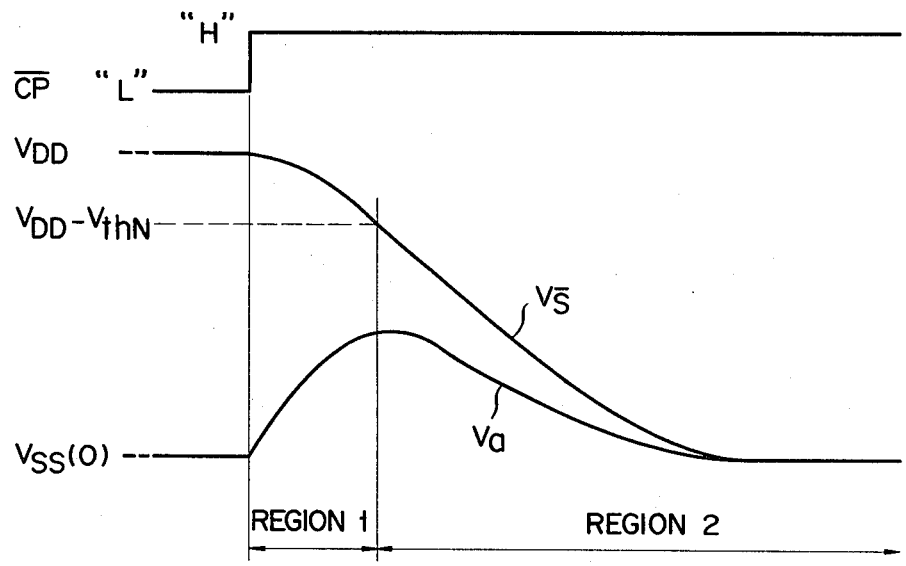
FIG. 21 is a curve diagram showing changes in the operating condition illustrated in FIG. 20.

FIG. 20 collectively shows the operating conditions of the transistors used in the fourth embodiment at the fall of the signal $\overline{Q_S}$. FIG. 21 illustrates variations in the levels of the voltages $V_a$, $V_{\bar{S}}$ at the junctions a, $\bar{S}$ resulting from the operating conditions of the respective transistors. The operation of the circuit of the fourth embodiment of FIG. 17 can be quantitatively analyzed by the direct application of the equations (15), (16) based on the foresaid divisional mensuration method. In this case, the initial value $V_a^{(0)}$ is taken to be zero. With the circuit of the third embodiment of FIG. 14, the N-MOS transistor 19 is converted from a nonconducting state to a conducting state. Thereafter, the voltage $V_a$ at the junction a first drops and then the voltage $V_{\bar{S}}$ at the junction $\bar{S}$ falls. With the circuit of FIG. 19 according to the fourth embodiment, a voltage $V_{DD}$ is impressed between the drain and source regions of the N-MOS transistor 19 immediately after it is converted from a nonconducting state to a conducting state. Therefore, the voltage $V_{\bar{S}}$ at the junction $\bar{S}$ instantly falls. As a result, the level of said voltage $V_{\bar{S}}$ falls to zero more quickly than in the case of the preceding third embodiment.

Figures 23, 24:
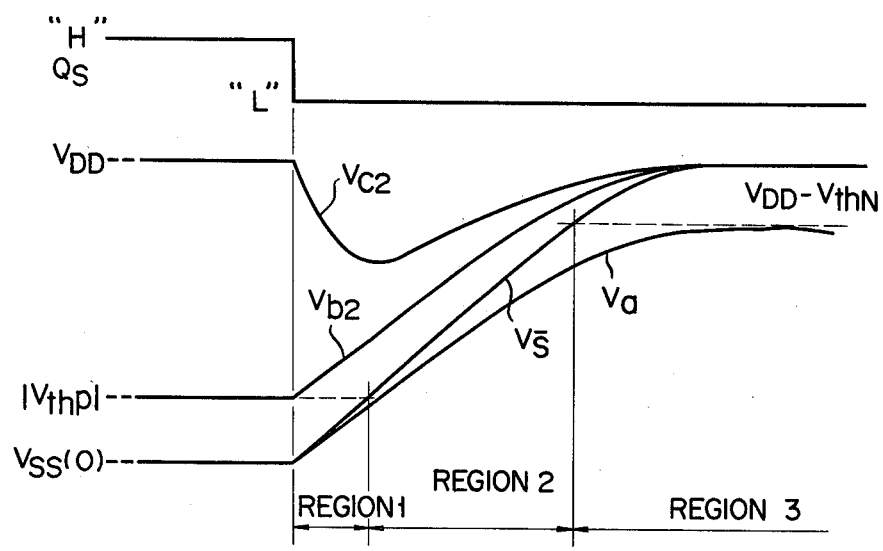
FIG. 23 shows the operating condition of the circuit arrangement of FIG. 20.
FIG. 24 is a curve diagram showing changes in the operating condition of FIG. 23.

FIG. 25 shows the arrangement of a device for drawing the waveforms of FIGS. 16, 21 and 24 by the divisional mensuration method. The analyzer receives from an input device 31 data on the voltage equations at the respective junctions and physical parameters such as a threshold value, the mobility of electrons and the concentration of an impurity in a substrate. The program of the divisional mensuration method itself is used as a control device 32. Data on the voltage equations and physical parameters delivered from the input device 31 are stored in a memory device 33 or input register 34. The physical parameters stored in the input register 34 are first supplied as initial values to an output register 35, and then sent forth from an output device 36. Thereafter data received is successively analyzed by actuating an arithmetic operation device 37 under control by the control device 32. The result of analysis is issued from the output device 36 through the output register 35. Referring to FIG. 25, a solid line arrow denotes the direction in which data is transmitted. A broken line arrow represents the direction in which a control signal is conducted.

Figure 22:
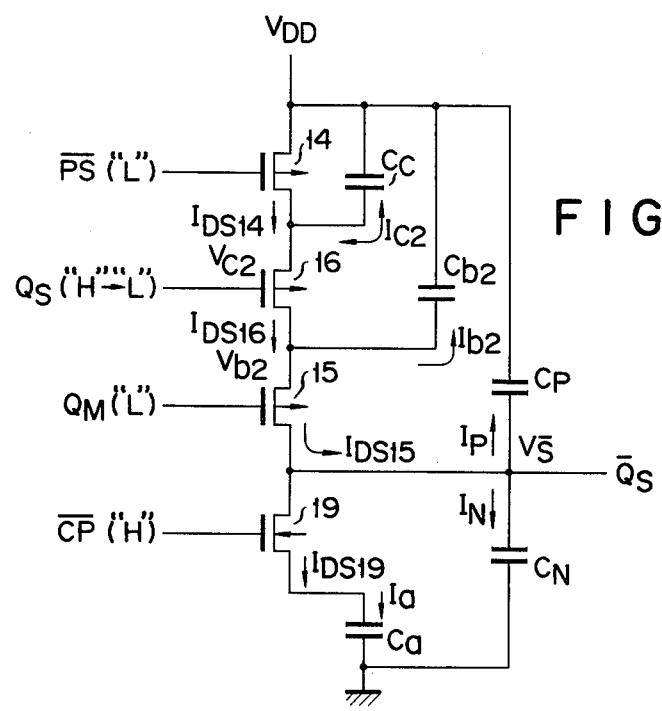
FIG. 22 typically shows the operation of the circuit arrangement of FIG. 20.

There will now be discussed the rising characteristic of a signal $\overline{Q_S}$ produced in the circuit of FIG. 17. FIG. 22 typically shows the operation of a circuit arrangement when the signal $\overline{Q_S}$ rises from the same analysis as applied when said signal $\overline{Q_S}$ falls. Now let it be assumed that a preset signal $\overline{PS}$ and input signals $Q_S$, $Q_M$ all have a low level L. Then P-MOS transistors 14, 15, 16 are rendered conducting. Therefore, the capacitors $C_N$, $C_P$ are charged with electric energy supplied from the power supply terminal $V_{DD}$, thereby increasing the level of the voltage $V_{\bar{S}}$ at the junction $\bar{S}$. However, and part of the electric charge delivered from the power supply terminal $V_{DD}$ flows into the capacitor $C_a$. Since an N-MOS transistor 19 is of the enhancement type, the voltage does not rise above a level $V_{DD}-V_{thN}$. Thus, the semiconductor integrated circuit device of FIG. 17 has the drawback that part of the electric energy delivered from the power supply terminal $V_{DD}$ does not contribute to improvement of the rising characteristic of the output signal $\overline{Q_S}$. FIG. 23 collectively shows the operating conditions of the transistors included in the circuit device of FIG. 17 when an output signal $\overline{Q_S}$ corresponding to an input signal $Q_S$ rises. FIG. 24 shows changes in the levels of the voltages $V_a$, $V_{b2}$, $V_{c2}$, $V_{\overline{S}}$ at the junctions a, b2, c2, $\overline{S}$ resulting from the operating conditions of the transistors indicated in FIG. 23.

There will now be described by reference to FIG. 26 a semiconductor integrated circuit device according to a fifth embodiment of this invention, which has been accomplished in consideration of the above-mentioned drawback. With the fifth embodiment of FIG. 26, a resistor 21 is connected between the drains of mutually facing P-MOS transistors 11, 14 whose gates are used in common, and a resistor 22 is connected between mutually facing P-MOS transistors 13, 16 whose gates are used in common. FIG. 27 illustrates a pattern appearing on the semiconductor integrated circuit device according to the fifth embodiment of FIG. 26. The resistors 21, 22 shown in FIG. 27 are formed, for example, by diffusing a P+ impurity.

Figure 26:
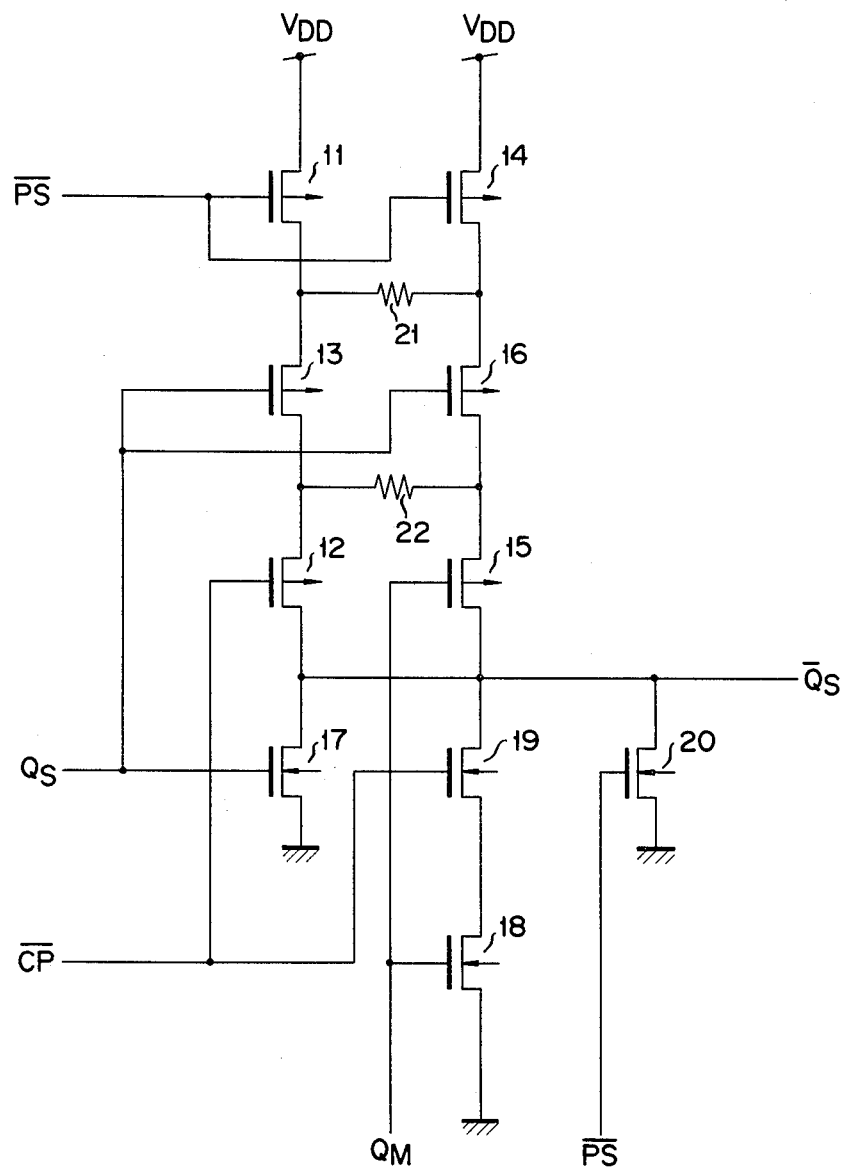
FIG. 26 shows the arrangement of a semiconductor integrated circuit device according to a further embodiment of the invention.
Figure 27:
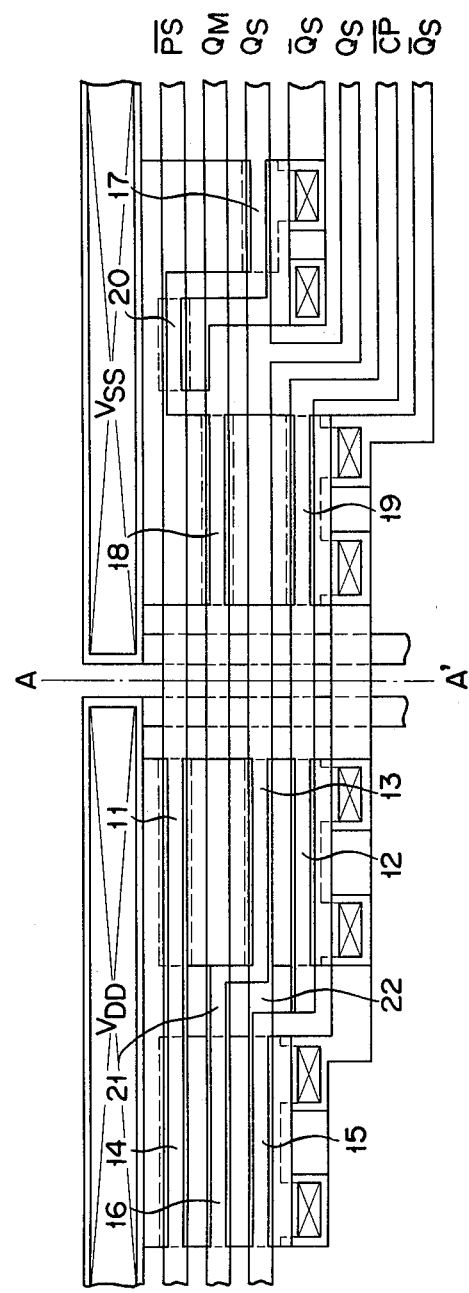
FIG. 27 is a plan view of a pattern defined by the circuit of FIG. 26 when integrated.
Figure 28:
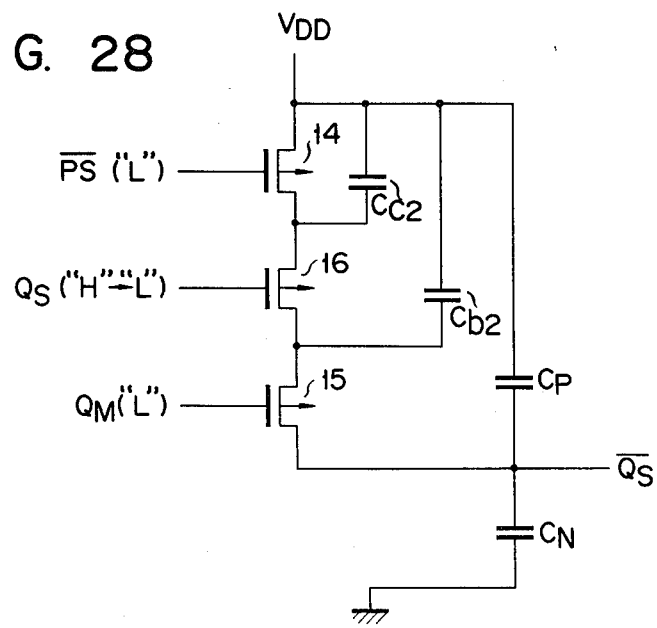
FIGS. 28 and 29 set forth typical circuit arrangements indicating the operation of the embodiment of FIG. 26.
Figure 29:
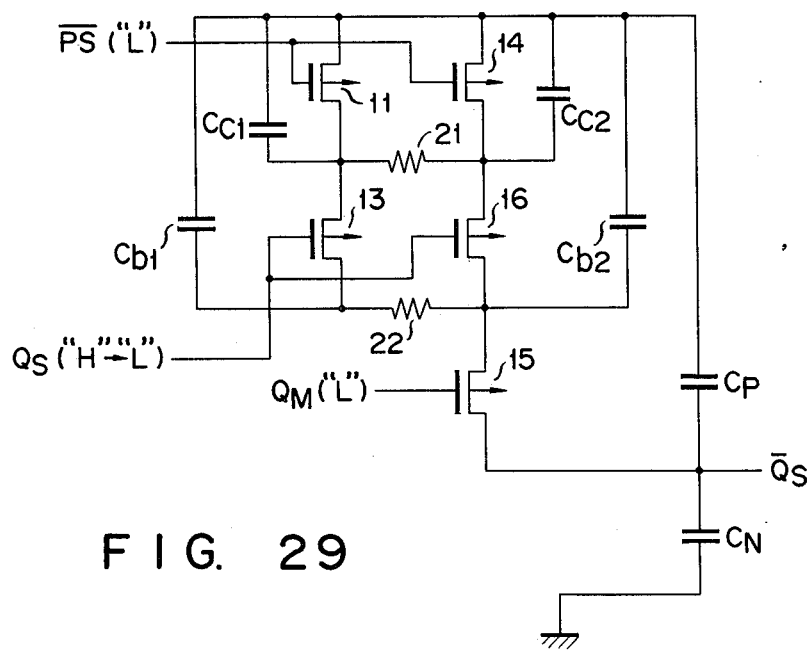

There will now be described the operation of the semiconductor integrated circuit device according to the fifth embodiment which is arranged as shown in FIG. 26. Now let it be assumed that the integrated circuit device is stably operated with a signal $Q_S$ having a high level H and a signal $\overline{Q_S}$ having a low level L under the condition in which a preset signal $\overline{PS}$ and a signal $Q_M$ have a low level L alike and a signal $\overline{Q_M}$ has a high level H. Later, a clock pulse $\overline{CP}$ has its level converted from L to H. Since, at this time, the preset signal $\overline{PS}$ has a low level L, an N-MOS transistor 20 is rendered nonconducting, and P-MOS transistors 11, 14 are rendered conducting. Further, since the signal $Q_M$ has a low level L, an N-MOS transistor 18 is rendered nonconducting, and a P-MOS transistor 15 is put into operation. When an output signal rises, the signal $\overline{CP}$ may be considered to have a high level H. Therefore, an N-MOS transistor 19 is rendered conducting, and a P-MOS transistor 12 becomes operative. While, during the above-described initial condition, the signal $Q_S$ has its level converted from H to L, an N-MOS transistor 17 is being converted from the conducting to the non-conducting state, whereas the P-MOS transistors 13, 16 are being conversely converted from the nonconducting to the conducting state. Therefore, only the P-MOS transistors 11, 13, 14, 16, 15 contribute to improvement on the rising characteristic of the output signal. $\overline{Q_S}$. FIG. 28 typically shows the circuit arrangement, in the case where the resistors 21, 22 of the fifth embodiment are omitted. According to the circuit arrangement of FIG. 28, the capacitors $C_N$, $C_P$ are charged only by a series circuit formed of the P-MOS transistors 14, 16, 15, causing the output signal $\overline{Q_S}$ to rise slowly. In contrast, according to the circuit arrangement of FIG. 29, in which the resistors 21, 22 of the fifth embodiment are used, the capacitors $C_N$, $C_P$ are charged by not only the series circuit formed of the P-MOS transistors 14, 16, 15, but also a series circuit formed of the P-MOS transistor 11, resistor 21, and P-MOS transistors 16, 15 and another series circuit formed of the P-MOS transistors 11, 13, resistor 22 and P-MOS transistor 15. Therefore, the output signal $\overline{Q_S}$ rises quickly, enabling the level of the voltage $V_{\overline{S}}$ at the junction $\overline{S}$ to be raised to the voltage level of the power supply terminal $V_{DD}$ at a higher speed.

This invention is not limited to the foregoing embodiments. Throughout these embodiments, the MOS type semiconductor integrated circuit device comprised an AND gate and NOR gate. Obviously, this invention is applicable to any other MOS type semiconductor integrated circuit device.

This invention provides a MOS type semiconductor integrated circuit device which can be accelerated in operation, as previously described, due to an output signal from said device being enabled to rise and fall at a higher speed than has been possible in the past.

What we claim is:

1. A semiconductor integrated logic circuit device for delivering a signal to an output terminal in response to a plurality of input signals, including clock and control signals, and being connected to first and second power sources, said device comprising:

a first logic circuit including a plurality of first series circuits, each first series circuit being constructed by connecting in a series a plurality of MOS transistors of a first conductivity type having drain, gate and source electrodes, with a predetermined one of said source electrodes of each first series circuit being connected to the first power source and a predetermined one of said drain electrodes of each first series circuit being connected to the output terminal to dispose said first series circuits in parallel between the first power source and the output terminal, said predetermined ones of said drain and said source electrodes collectively defining a set of electrodes;

a second logic circuit including a plurality of second series circuits connected in parallel between the second power source and the output terminal, each second series circuit being constructed by connecting at least one MOS type transistor of a second conductivity type having drain, gate and source electrodes, in series between the second power source and the output terminals;

each of said gate electrodes of said first and second logic circuits receiving one of the input signals wherein at least one of the transistors of said first logic circuit receives the clock signal and wherein the rest of the transistors of said first logic circuit not receiving said clock signal receive the control signals, with a predetermined number of transistors of said first logic circuit together defining a first set of transistors with each transistor of said first set of transistors being selected from a different one of said first series circuits and with the gate electrodes of said first set of transistors all connected in common to receive the same input signal; and first electrical resistor means connecting at least one pair of like electrodes other than said gate electrodes of said first set of transistors, wherein said like electrodes are selected from other than said set of electrodes.

2. A semiconductor integrated logic circuit device according to claim 1 wherein said first logic circuit further includes a second set of transistors connected like said first set of transistors, the common gate electrodes of said first set of transistors receiving a different input signal than the common gate electrodes of said second set of transistors, and second electrical resistor means connected between the drain electrodes of said second set of transistors, with said first electrical resistor means being connected between the source electrodes of said first set of transistors.

3. A semiconductor integrated logic circuit device according to claim 1 or 2, wherein among said plurality of MOS type transistors of said first logic circuit connected in series between the first power source and the output terminal, those transistors supplied with the clock signal are disposed closer to said output terminal than those supplied with the control signals.

* * * * *